(12) United States Patent
Achkire et al.

(10) Patent No.: US 6,955,516 B2
(45) Date of Patent: Oct. 18, 2005

(54) SINGLE WAFER DRYER AND DRYING METHODS

(75) Inventors: Younes Achkire, Los Gatos, CA (US); Alexander Lerner, San Jose, CA (US); Boris T. Govzman, Sunnyvale, CA (US); Boris Fishkin, San Carlos, CA (US); Michael Sugarman, San Francisco, CA (US); Rashid Mavliev, Campell, CA (US); Haoquan Fang, San Jose, CA (US); Shijian Li, San Jose, CA (US); Guy Shirazi, Mountain View, CA (US); Jianshe Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 10/286,404

(22) Filed: Nov. 1, 2002

(65) Prior Publication Data

US 2003/0121170 A1 Jul. 3, 2003

Related U.S. Application Data

(60) Provisional application No. 60/335,335, filed on Nov. 2, 2001.

(51) Int. Cl.$^7$ ................................................. B65G 1/133
(52) U.S. Cl. ................................... 414/217; 414/939
(58) Field of Search ................................ 414/217, 939

(56) References Cited

U.S. PATENT DOCUMENTS

| | | | | |
|---|---|---|---|---|
| 4,534,314 A | * | 8/1985 | Ackley | 118/733 |
| 4,548,699 A | * | 10/1985 | Hutchinson et al. | 204/298.25 |
| 4,647,266 A | * | 3/1987 | Coad et al. | 414/226.01 |
| 5,154,730 A | * | 10/1992 | Hodos et al. | 29/25.01 |
| 5,215,420 A | * | 6/1993 | Hughes et al. | 414/217 |
| 5,425,611 A | * | 6/1995 | Hughes et al. | 414/217 |
| 5,616,063 A | * | 4/1997 | Okumura et al. | 451/1 |
| 6,068,441 A | * | 5/2000 | Raaijmakers et al. | 414/609 |
| 6,083,566 A | * | 7/2000 | Whitesell | 427/445 |
| 6,095,741 A | * | 8/2000 | Kroeker et al. | 414/217 |
| 6,273,802 B1 | * | 8/2001 | Okumura et al. | 451/287 |
| 6,425,806 B2 | * | 7/2002 | Okumura et al. | 451/41 |
| 6,439,971 B2 | * | 8/2002 | Okumura et al. | 451/41 |
| 6,443,808 B2 | * | 9/2002 | Okumura et al. | 451/5 |
| 6,547,638 B2 | * | 4/2003 | Okumura et al. | 451/5 |

FOREIGN PATENT DOCUMENTS

| | | |
|---|---|---|
| EP | 0 833 375 A2 | 4/1998 |
| WO | WO 00/28578 A | 5/2000 |

OTHER PUBLICATIONS

U.S. Appl. No. 2001/0004898A1, dated Jun. 28, 2001.
U.S. Appl. No. 2001/0004899A1, dated Jun. 28, 2001.
U.S. Appl. No. 2001/0010997A1, dated Aug. 2, 2001.

* cited by examiner

*Primary Examiner*—Alfred Basichas
(74) *Attorney, Agent, or Firm*—Dugan & Dugan

(57) ABSTRACT

In a first aspect, a module is provided that is adapted to process a wafer. The module includes a processing portion having one or more features such as (1) a rotatable wafer support for rotating an input wafer from a first orientation wherein the wafer is in line with a load port to a second orientation wherein the wafer is in line with an unload port; (2) a catcher adapted to contact and travel passively with a wafer as it is unloaded from the processing portion; (3) an enclosed output portion adapted to create a laminar air flow from one side thereof to the other; (4) an output portion having a plurality of wafer receivers; (5) submerged fluid nozzles; and/or (6) drying gas flow deflectors, etc. Other aspects include methods of wafer processing.

20 Claims, 26 Drawing Sheets

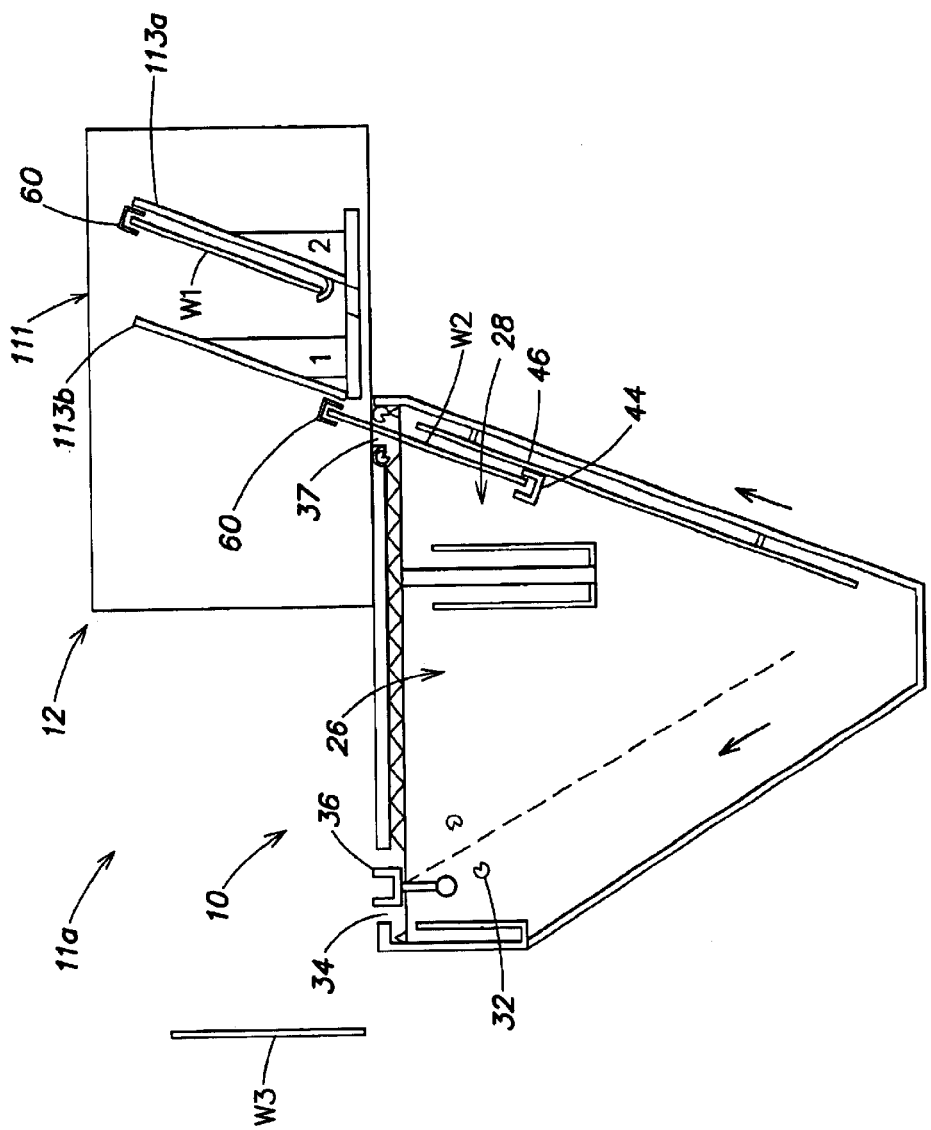

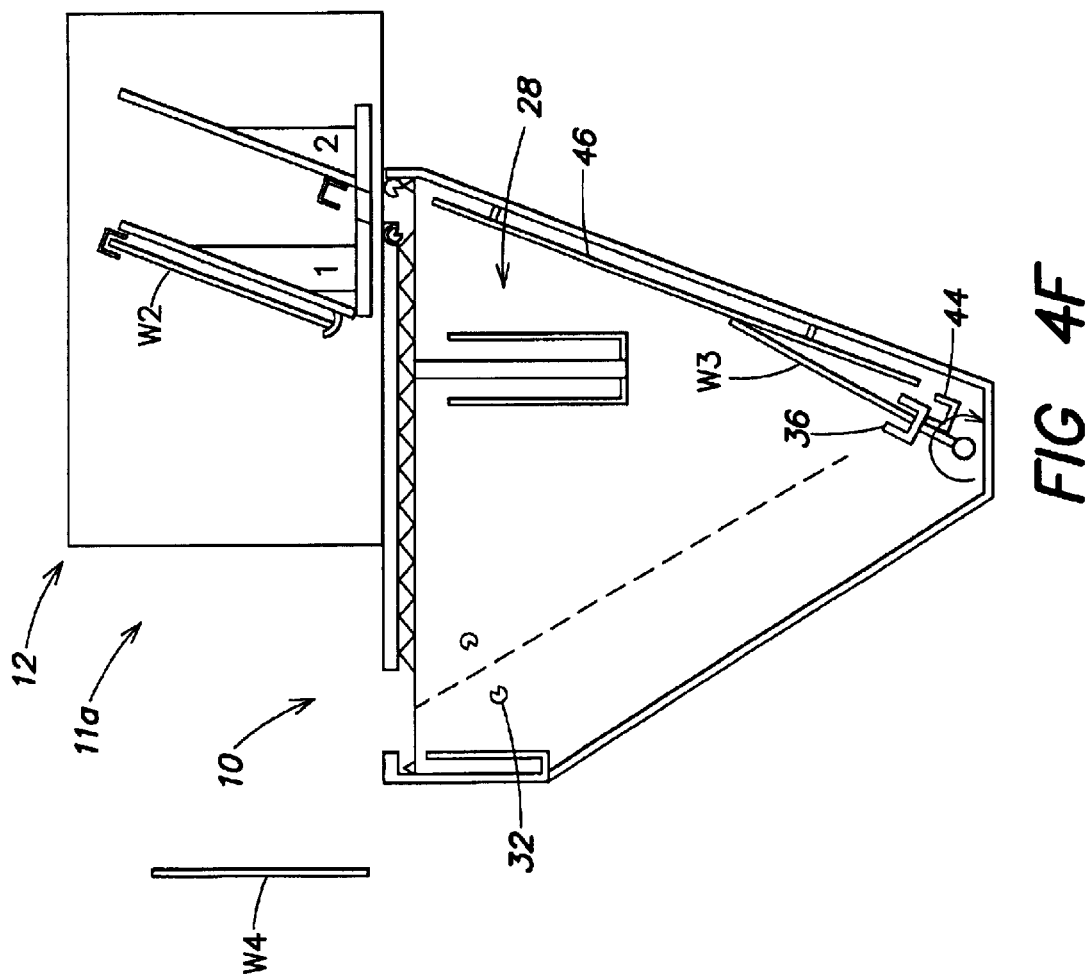

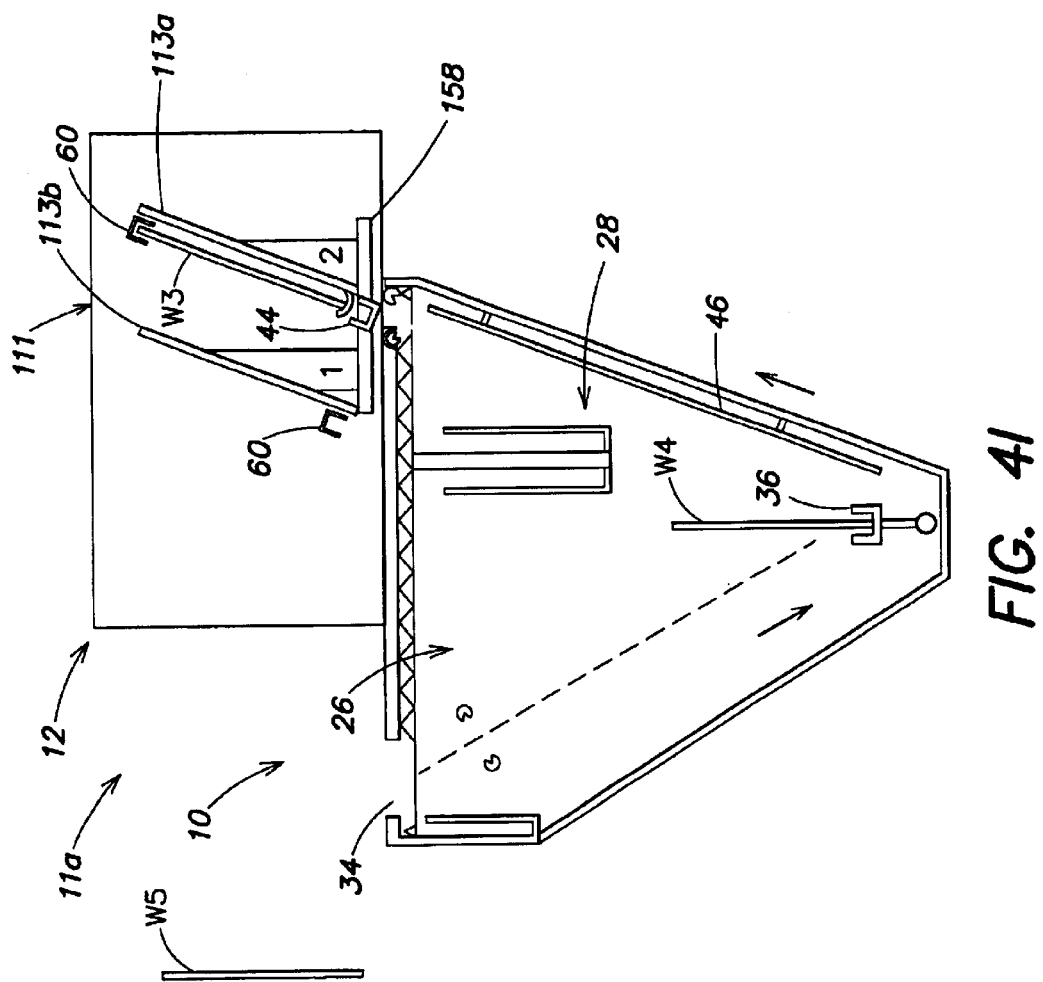

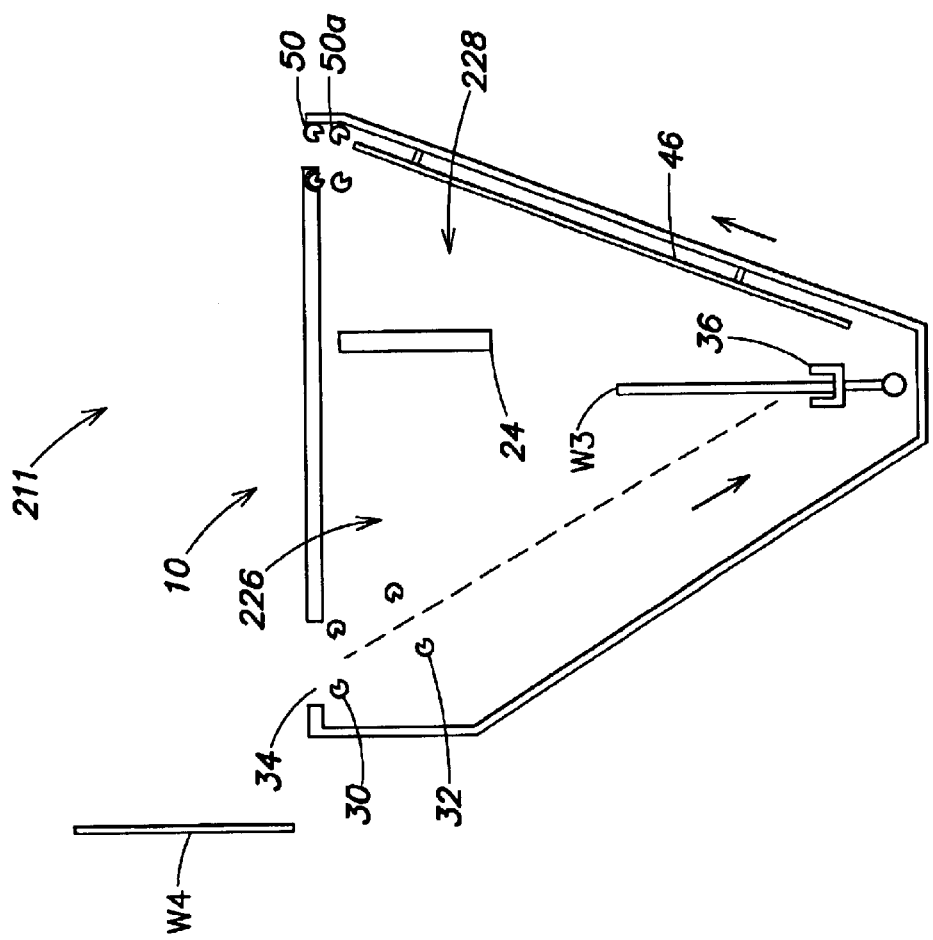

| SURFACE MATERIAL | PREFERRED FLOW ANGLE |
|---|---|
| SILICON (DRY IN–DRY OUT) | 12° – 38° |
| BLANKET COPPER (DRY IN–DRY OUT) | 12° – 35° |
| COPPER OXIDE (DRY IN–DRY OUT) | 12° – 30° |
| POLISHED BLACK DIAMOND (WET IN–DRY OUT) | 22° – 38° |
| POLISHED BLACK DIAMOND BACKSIDE (WET IN–DRY OUT) | 22° – 30° |

FIG. 8B

SINGLE WAFER DRYER AND DRYING METHODS

This application claims priority from U.S. Provisional Patent Application Serial No. 60/335,335, filed Nov. 2, 2001, which is hereby incorporated by reference herein in its entirety.

FIELD OF THE INVENTION

This invention is concerned with semiconductor manufacturing and is more particularly concerned with techniques for drying a substrate.

BACKGROUND OF THE INVENTION

As semiconductor device geometries continue to decrease, the importance of ultra clean processing increases. Aqueous cleaning within a tank of fluid (or a bath) followed by a rinsing bath (e.g., within a separate tank, or by replacing the cleaning tank fluid) achieves desirable cleaning levels. After removal from the rinsing bath, absent use of a drying apparatus, the bath fluid would evaporate from the substrate's surface causing streaking, spotting and/or leaving bath residue on the surface of the substrate. Such streaking, spotting and residue can cause subsequent device failure. Accordingly, much attention has been directed to improved methods for drying a substrate as it is removed from an aqueous bath.

A method known as Marangoni drying creates a surface tension gradient to induce bath fluid to flow from the substrate in a manner that leaves the substrate virtually free of bath fluid, and thus may avoid streaking, spotting and residue marks. Specifically, during Marangoni drying a solvent miscible with the bath fluid (e.g., IPA vapor) is introduced to a fluid meniscus which forms as the substrate is lifted from the bath or as the bath fluid is drained past the substrate. The solvent vapor is absorbed along the surface of the fluid, with the concentration of the absorbed vapor being higher at the tip of the meniscus. The higher concentration of absorbed vapor causes surface tension to be lower at the tip of the meniscus than in the bulk of the bath fluid, causing bath fluid to flow from the drying meniscus toward the bulk bath fluid. Such a flow is known as a "Marangoni" flow, and can be employed to achieve substrate drying without leaving streaks, spotting or bath residue on the substrate.

SUMMARY OF THE INVENTION

In a first aspect of the invention, a first module is provided that is adapted to process a wafer. The module includes a processing portion having a load port through which a wafer may be lowered into the processing portion, and an unload port, horizontally displaced from the load port, such that the wafer may be raised out of the processing portion at the unload port. The module also includes a rotatable wafer support for rotating an input wafer from a first orientation wherein the wafer is in line with the load port, to a second orientation wherein the wafer is in line with the unload port.

In a second aspect of the invention, a second module is provided that is adapted to process a wafer. The second module includes a processing portion having the load port and unload port described with regard to the first module. The second module also includes (1) an external overflow weir positioned along the exterior of the processing portion; and (2) a separation wall positioned between the load port and the unload port so as to divide an upper region of the processing portion into a first section and a second section, and so as to deter surface fluid from traveling between the first section and the second section.

In a third aspect of the invention, a third module is provided that is adapted to process a wafer. The third module includes a processing portion having the load port described with regard to the first module. The third module also includes a spray mechanism adapted to be submerged in fluid contained in the processing portion during processing, and positioned so as to spray fluid to the underwater surface of a wafer as the wafer is lowered through the load port.

In a fourth aspect of the invention, a fourth module is provided that is adapted to process a wafer. The fourth module includes a processing portion having the load port and unload port described with regard to the first module. The fourth module also includes an output portion having (1) a first wafer receiver adapted to receive a wafer raised through the unload port; and (2) a catcher coupled to the wafer receiver and adapted to contact a wafer being elevated from the unload port and to elevate passively therewith.

In a fifth aspect of the invention, a fifth module is provided that is adapted to process a wafer. The fifth module includes a processing portion having the load port and unload port described with regard to the first module. The fifth module also includes an output portion having a first wafer receiver adapted to receive a wafer raised through the unload port, and an enclosure surrounding the first wafer receiver. The enclosure includes (1) a first opening adapted such that a wafer may be raised from the processing portion, through the unload port, to the first wafer receiver; (2) a second opening adapted to allow a wafer handler to extract a wafer from the first wafer receiver; and (3) a plurality of additional openings adapted to allow a laminar flow of air to be established within the enclosure.

In a sixth aspect of the invention, a sixth module is provided that is adapted to process a wafer. The fifth module includes a processing portion having the load port and unload port described with regard to the first module. The fifth module also includes an output portion having (1) a first wafer receiver adapted to receive a wafer raised through the unload port; and (2) a second wafer receiver adapted to receive a wafer raised through the unload port. The first and second wafer receivers are adapted to translate between a first position wherein the first wafer receiver is positioned to receive a wafer raised through the unload port, and a second position wherein the second wafer receiver is positioned to receive a wafer raised through the unload port. Numerous other aspects are provided, as are methods, apparatus and systems in accordance with these and other aspects.

Other features and aspects of the present invention will become more fully apparent from the following detailed description, the appended claims and the accompanying drawings.

BRIEF DESCRIPTION OF THE DRAWINGS

FIGS. 2A–I are schematic side views of the inventive drying apparatus of FIG. 1 showing sequential stages of wafer transport through, and output from, the inventive drying apparatus;

FIGS. 4A–I are schematic side views of the inventive drying apparatus of FIGS. 3A–B showing sequential positions of the output portion during wafer output thereto;

FIG. 5 is a schematic side view showing the inventive drying apparatus wherein the processing portion is configured according to a second aspect;

FIG. 8B is a table showing preferred vapor flow angles for drying substrates comprising various materials.

DETAILED DESCRIPTION OF THE PREFERRED EMBODIMENTS

A drying apparatus provided in accordance with the present invention comprises a processing portion and an output portion. The processing portion includes a main chamber that may be configured according to two main aspects. A first aspect (submersion chamber 18a) submerges a wafer in a bath of fluid and is shown and described with reference to FIGS. 1–2I; a second aspect (spray chamber 18b) sprays an unsubmerged wafer with fluid and is shown and described with reference to FIG. 5.

Similarly, the output portion includes an output platform that may be configured according to two main aspects. A first aspect (rotation platform 58) rotates a wafer from a generally vertical orientation to a generally horizontal orientation and is shown and described with reference to FIGS. 1–2I; a second aspect (translation platform 158) translates horizontally so as to receive a generally vertically oriented wafer in one of a plurality of wafer receivers, and is shown and described with reference to FIGS. 3A–4K.

Each aspect of the processing portion and output portion is considered inventive on its own. Accordingly, each aspect of the processing portion may be used with either aspect of the output portion, and vice versa. Additionally each aspect of the processing portion and the output portion may be used with conventional output portions and processing portions, respectively. Finally, numerous individual features of the processing portions and output portions are inventive, as will be apparent with reference to the figures and the description that follows.

Figure 1:
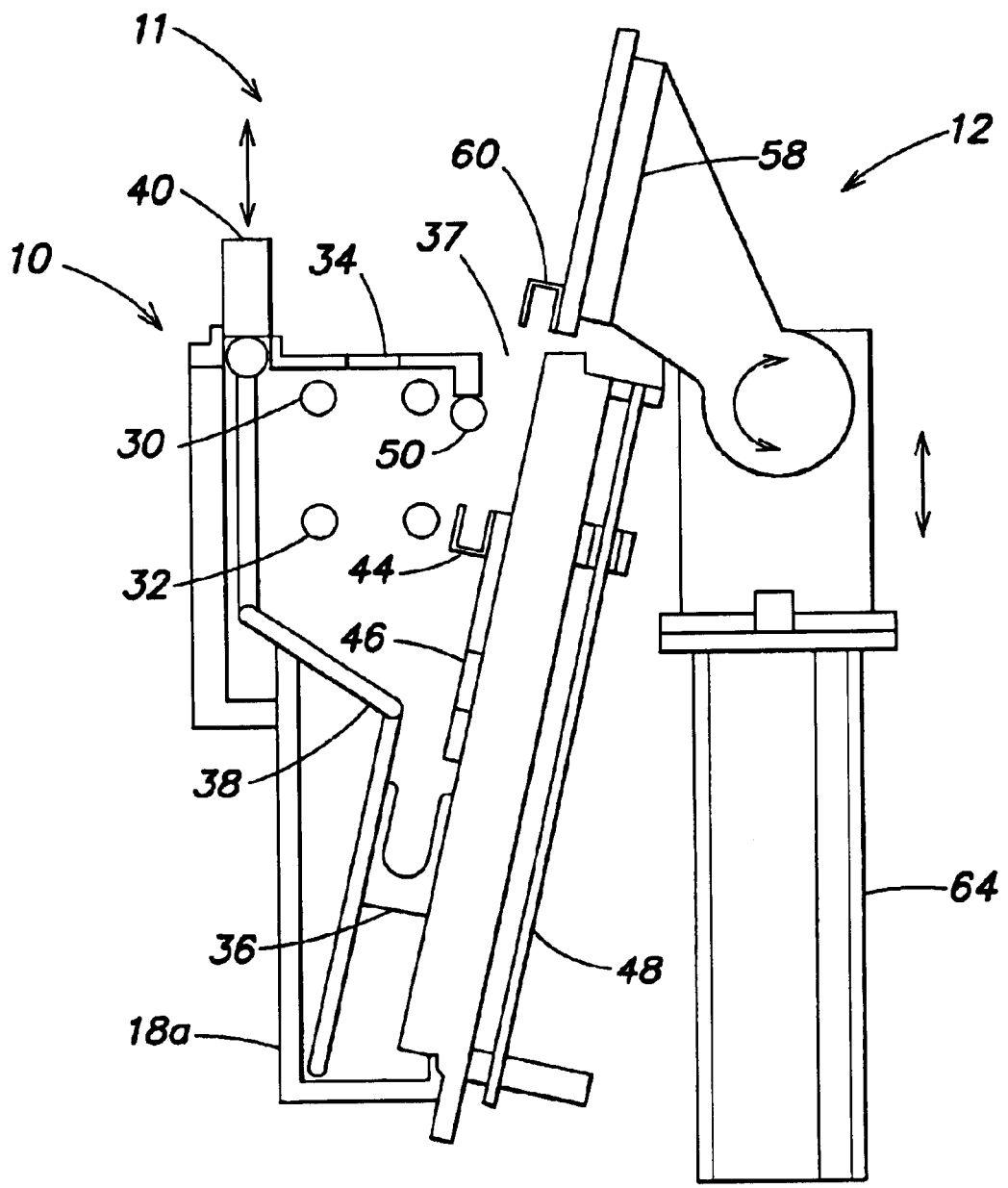
FIG. 1 is a schematic side view of an inventive drying apparatus comprising a processing portion, and an output portion, both configured according to a first aspect.

FIG. 1 is a side schematic view of an inventive drying apparatus 11 in which the processing portion and the output portion are configured according to a first aspect of the present invention. The inventive drying apparatus 11 comprises a processing portion 10 and an output portion 12.

Processing Portion—First Aspect

The processing portion 10 comprises a submersion chamber 18a which submerges a wafer in a bath of fluid, such as deionized water, and which may or may not include a surfactant, or other cleaning chemistry such as Applied Materials' ElectraClean™ solution.

An upper separation wall 24 (FIG. 2A) divides the submersion chamber 18a into two sections: a rinsing section 26 and a "drying" section 28. By separating the drying section 28 from the rinsing section 26, a cleaner exit zone is maintained and the risk of removed particles re-adhering to the wafer during drying is reduced, as particles tend to be removed in the rinsing section 26 and overflowed therefrom. The submersion chamber 18a may have an overflow weir 20 surrounding the chamber 18a such that fluid may be overflowed thereto. Fluid may be continuously supplied, for example, to the lower portion of the chamber 18a so that fluid continuously overflows to the weir 20. An overflow weir 20a (FIGS. 2A–I) may be coupled to the upper separation wall 24 to aid in removing particles from the rinsing section 26 as well as from the drying section 28. High and low fluid level sensors (not shown) may be coupled to both the chamber 18a and the weirs 20, 20a. In an alternative aspect, not shown, the overflow weir 20 may comprise a chamber in which the processing portion 10 is mounted. An exhaust line (e.g., a facilities exhaust line) may be coupled to the chamber (e.g., near the bottom thereof) and a drain line may be positioned along the bottom of the chamber, which may be slanted to facilitate drainage.

The rinsing section 26 may be equipped with overhead spray nozzles 30 and/or submerged spray nozzles 32 each of which are adapted to direct fluid to the surface of the wafer as it enters the rinsing section 26. The rinsing section 26 may, in one aspect, be used to rinse from the wafer any fluid film (e.g., surfactant) which may have been sprayed on the wafer prior to transfer into the inventive drying apparatus 11. It has been found that such a surfactant spraying step prevents a hydrophobic wafer from drying during transfer to the inventive apparatus 11. A surfactant spray (preferably a spray containing a low concentration of a surfactant such as an Alfonic surfactant) is therefore desirable prior to loading the wafer into a drying apparatus in order to prevent the formation of watermarks on the wafer. Such an inventive process may be performed in a scrubber or during wafer transfer (e.g., a wafer handler or scrubber may comprise a mechanism for wetting the substrate with surfactant either during scrubbing or as the substrate is removed from the scrubber or during transfer via the wafer handler).

The rinsing section 26 further includes a load port 34, which may be merely a location through which the wafer passes as it enters the rinsing section 26, or which may be an opening defined by a top wall or lid (if any) of the rinsing section 26.

Located at or near the bottom of the submersion chamber 18a is a cradle 36, adapted to receive and support a generally vertically oriented wafer (which may be slightly inclined from normal). The cradle 36 is further adapted to rotate from a first position in which the cradle 36 may receive a wafer that enters the rinsing section 26 via the load port 34, to a second position in which a wafer may be lifted from the cradle 36 through an exit port 37 of the drying section 28. As the cradle 36 rotates the wafer from the rinsing section 26 to the drying section 28 the wafer remains submerged in the fluid.

A mechanism for rotating the cradle 36 is preferably mounted outside the processing portion 10 and is coupled to the cradle 36 either directly or magnetically through a wall of the processing portion 10. In the exemplary embodiment of FIG. 1, a linkage system 38 is configured to rotate the cradle 36 from the first position (within the rinsing section 26) to the second position (within the drying section 28) when the linkage is downwardly actuated, and to retract the cradle 36 from the drying section 28 to the rinsing section 26 when the linkage system 38 is upwardly actuated. An actuator 40 is shown coupled to the linkage system 38. The actuator 40 may be any conventional actuator such as an air cylinder or the like.

An alternative configuration for achieving cradle rotation may comprise mounting the cradle 36 on a rod that extends horizontally along the bottom of the submersion chamber 18a so that the cradle 36 may rotate about the rod. In such a configuration the cradle 36 may be, for example, nearly as wide as the submersion chamber 18a, such that a magnet may be mounted on both sides of the cradle 36, and may couple through the side walls of the chamber 18a to external magnets. The external magnets may be driven forward and backward by an actuator (such as pneumatic actuator 40). To facilitate rotation of both the cradle 36 and the external magnets, rollers may be mounted thereto so as to contact and roll along the side walls of the submersion chamber 18a.

A pair of sensors (not shown) may be coupled to the actuator 40, the linkage system 38 and/or the cradle 36 so as to detect the first and second cradle positions. Further, a sensor, such as an optical sensor (not shown) may detect the presence of the wafer on the cradle 36. Once wafer presence is detected a signal may be sent to the actuator 40 to cause the actuator 40 to rotate the cradle 36 from the first position to second position.

The drying section 28 may include a pusher 44 which is preferably adapted to contact the lower edge of the wafer with minimal contact area. Such pushers are conventionally referred to as knife-edged pushers. The knife-edged pusher 44 may be coupled to a vertical guide (not shown) positioned along the rear wall of the drying section 28, and may be further coupled (e.g., magnetically) to an actuator (for example a lead screw 48 of FIG. 1, driven by a motor) which is adapted to lift and lower the pusher 44 along the guide so that the pusher 44 may elevate a wafer from the drying section 28 and may then return to the pusher's original position below the cradle 36.

The rear wall of the drying section 28 is preferably inclined (e.g., nine degrees) such that the pusher maintains the wafer in an inclined position as it is elevated from the drying section 28, so as to ensure more repeatable wafer position than can be achieved with a non-inclined, vertical orientation.

A pair of inclined guides 46 may also be coupled to the rear wall of the drying section 28 and positioned so as to contact the opposing edges of the wafer as the wafer is lifted from the cradle 36 through the drying section 28. Each guide 46 may be include a slot such as V or U shaped slot in which the wafer's edge is held. Alternatively each guide 46 may include a beveled surface against which the wafer's edge may rest, or the guides 46 may be angled away from the wafer so as to minimize contact therewith.

The exit port 37 of the drying section 28 is preferably defined by a top wall or lid of the drying section 28, such that drying vapors may be exhausted therefrom (e.g., via a pump) rather than escaping into the surrounding atmosphere. Positioned above the fluid level but below the exit port 37 are a pair of spray mechanisms 50 adapted to provide a continuous spray of vapor across both the front and back surfaces of the wafer as the wafer is elevated from the fluid. Spray mechanisms 50 are positioned so as to spray vapor to a meniscus that forms as the wafer is lifted from the fluid. Although the spray mechanisms 50 may comprise a single linear nozzle, or a plurality of nozzles, they preferably comprise a tube having a line of holes formed therein (e.g., 114 holes having 0.005–0.007 inch diameters and being uniformly spaced along the 8.5 inches that are adjacent to the wafer). Such spray tubes 50 are preferably made of quartz or stainless steel.

Figure 8A:
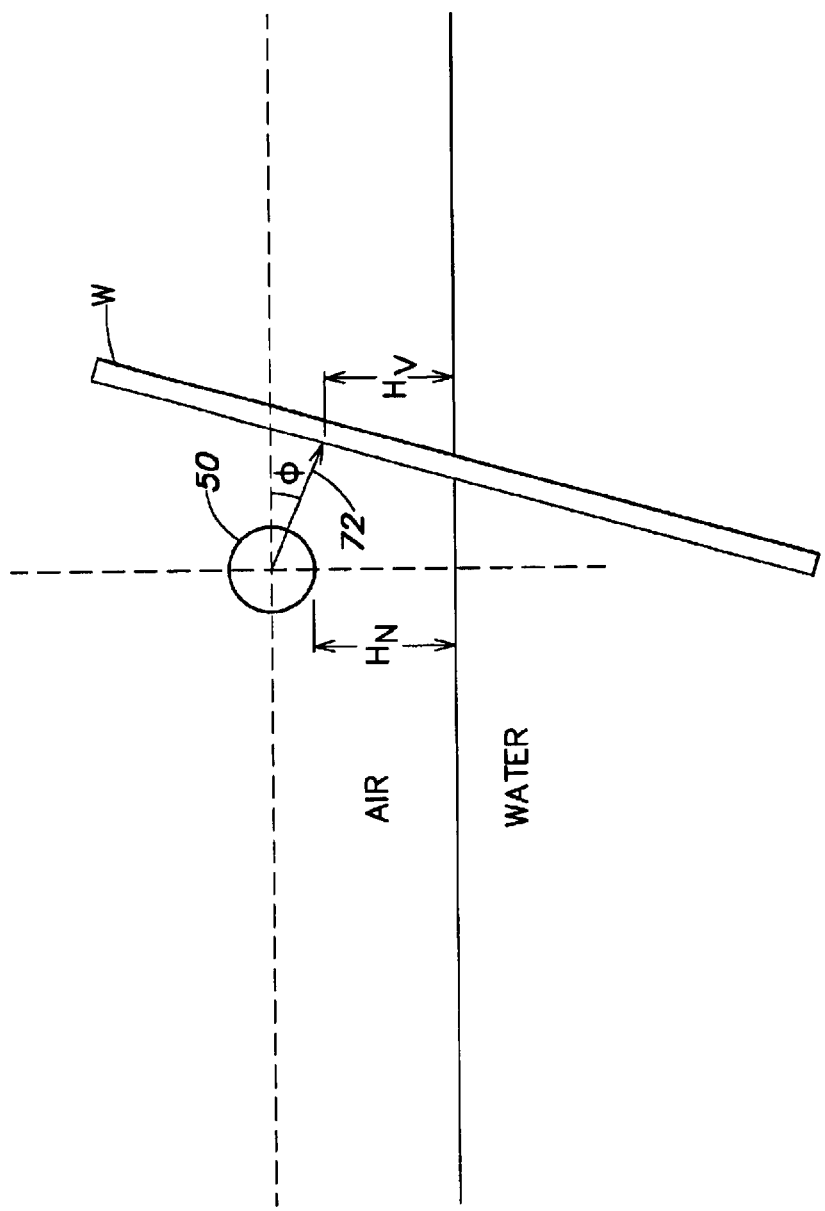
FIG. 8A is a schematic drawing useful in describing a vapor flow angle.

Each spray tube 50 may be manually oriented so as to direct a vapor flow (e.g., IPA vapor) at a desired angle (e.g., relative to a horizontal line drawn through the center of the tubes 50 and parallel to the fluid surface as shown in FIG. 8A). The IPA vapor flow may be directed with or without the aid of a flow deflector as described further with reference to FIG. 6. A specific angle of the flow may vary depending upon the material of the wafer to be dried. The table listing preferred flow angles for exemplary materials is shown in FIG. 8B.

The IPA vapor flow supplied to the fluid meniscus creates a Marangoni force that results in a downward liquid flow opposite to the wafer lift direction. Thus, the wafer surface above the meniscus is dried.

In order to contain and exhaust the IPA vapor inside the drying section 28, an exhaust manifold 51 and a nitrogen blanket manifold 54 are provided. These manifolds may be built into a top cover 56 of the drying section 28, above the spray mechanisms 50. A gas flow module (not shown) coupled to spray mechanisms 50, the exhaust manifold 51 and the nitrogen blanket manifold 54 controls the IPA vapor flow rate, the exhaust rate and the nitrogen blanket flow rate. In addition, an exhaust line (not shown) may be located beneath the output portion 12 and may maintain a vertical laminar flow through the output portion 12, as well as diluting any IPA vapor that may escape from the drying section 28. The spray mechanisms 50 are preferably positioned close to the meniscus, and the nitrogen blanket manifold 54 is preferably positioned close to the unload port 37.

Wafer Processing—First Aspect

Figure 2A:
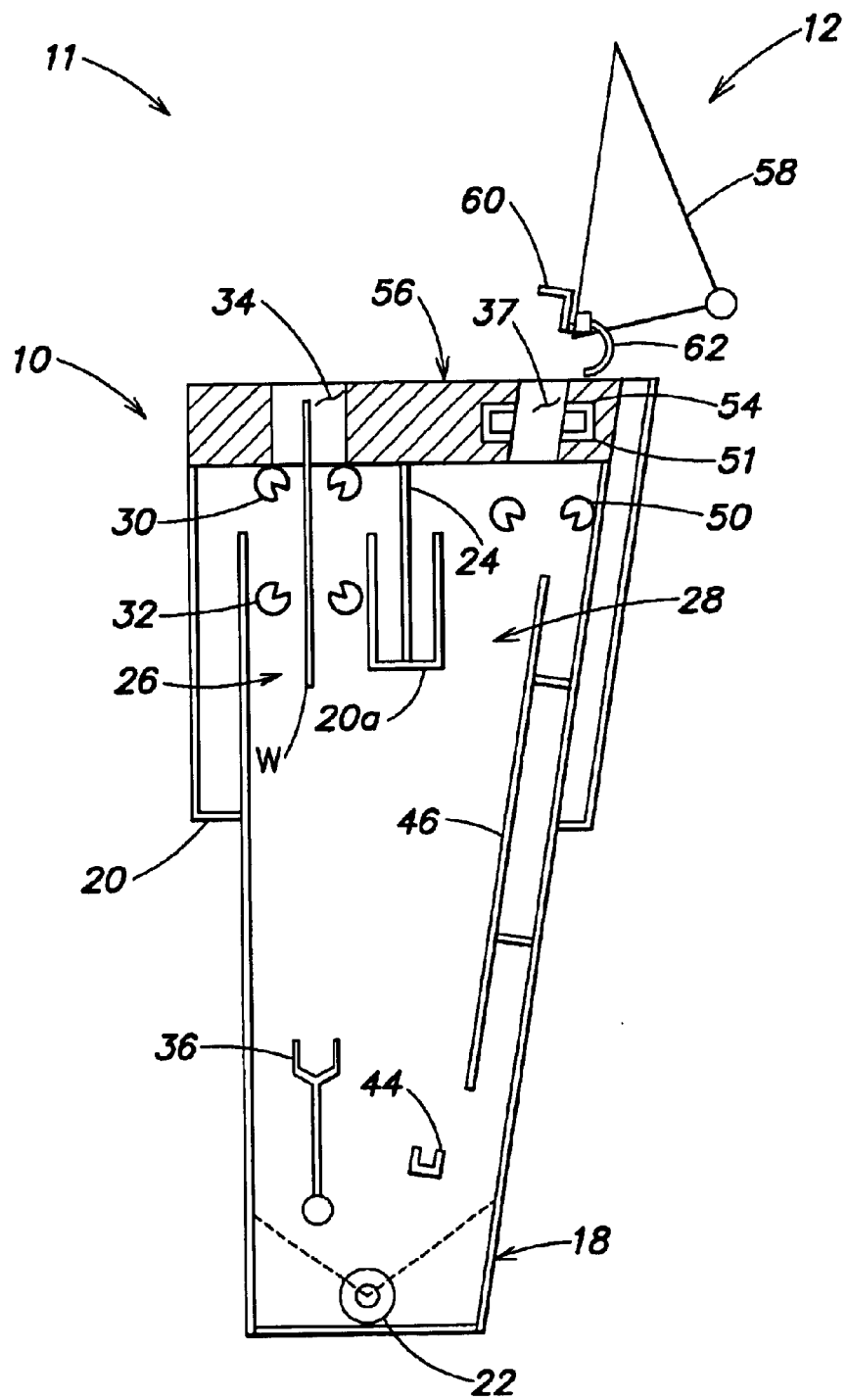
Figure 2B:
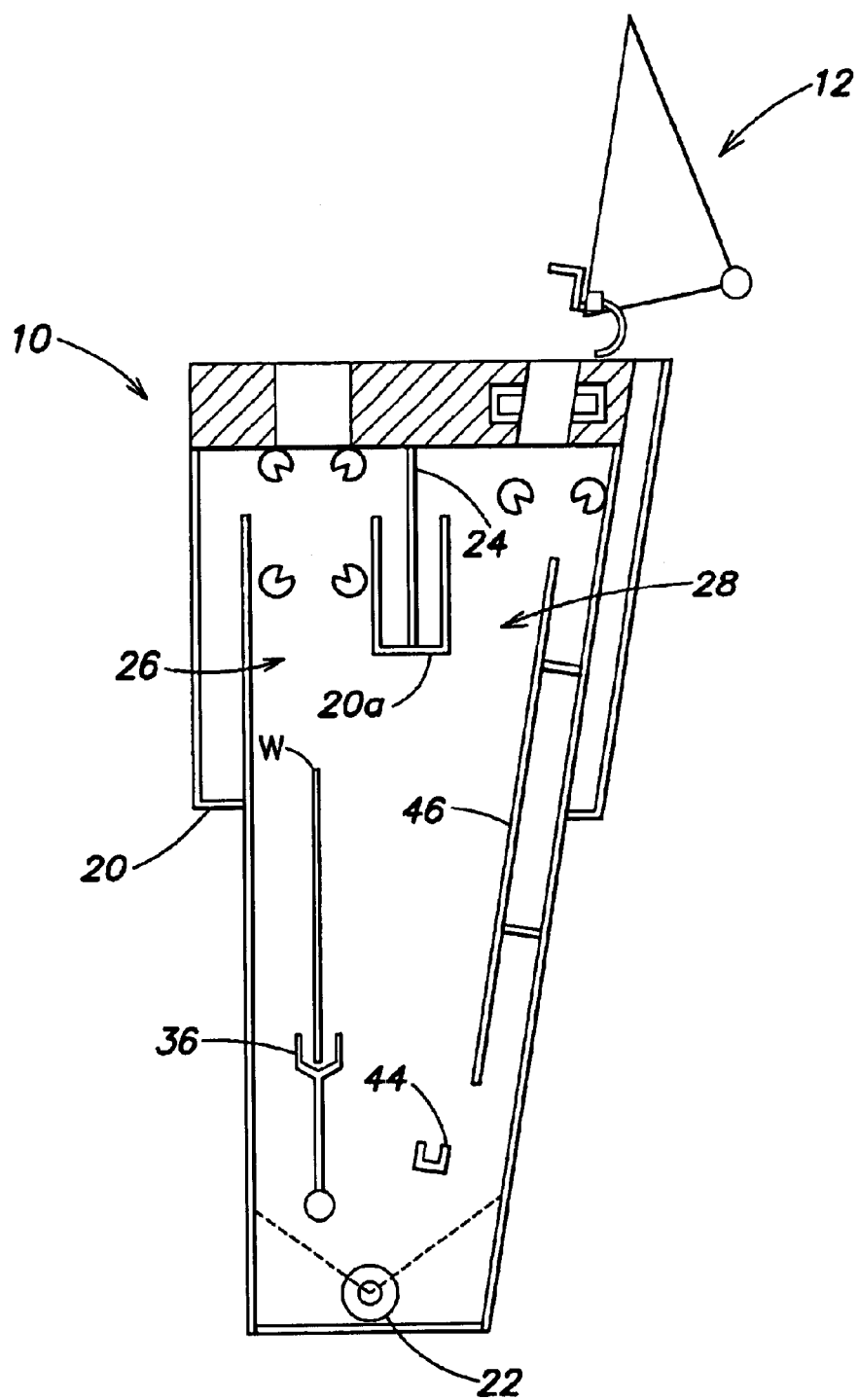

FIGS. 2A–I are schematic side elevational views which show a wafer at various stages as the wafer travels through the inventive apparatus 11. Referring to FIG. 2A, as a robot (such as a walking beam robot, not shown herein although disclosed in U.S. patent application Ser. No. 09/558,815, filed Apr. 26, 2000, the entire disclosure of which is incorporated herein by reference) loads the wafer W into the rinsing section 26 via the load port 34, the nozzles 30, 32 spray DI water onto both sides of the wafer W. The robot releases the wafer onto the cradle 36, and then retracts from the rinsing section 26 to its home position, above the loadport 34. An optical sensor (not shown) detects the presence of the wafer on the cradle 36 (FIG. 2B), and signals the actuator 40 to actuate the linkage system 38 thereby causing the cradle 36 to rotate from the rinsing section 26 to the drying section 28.

Figure 2C:
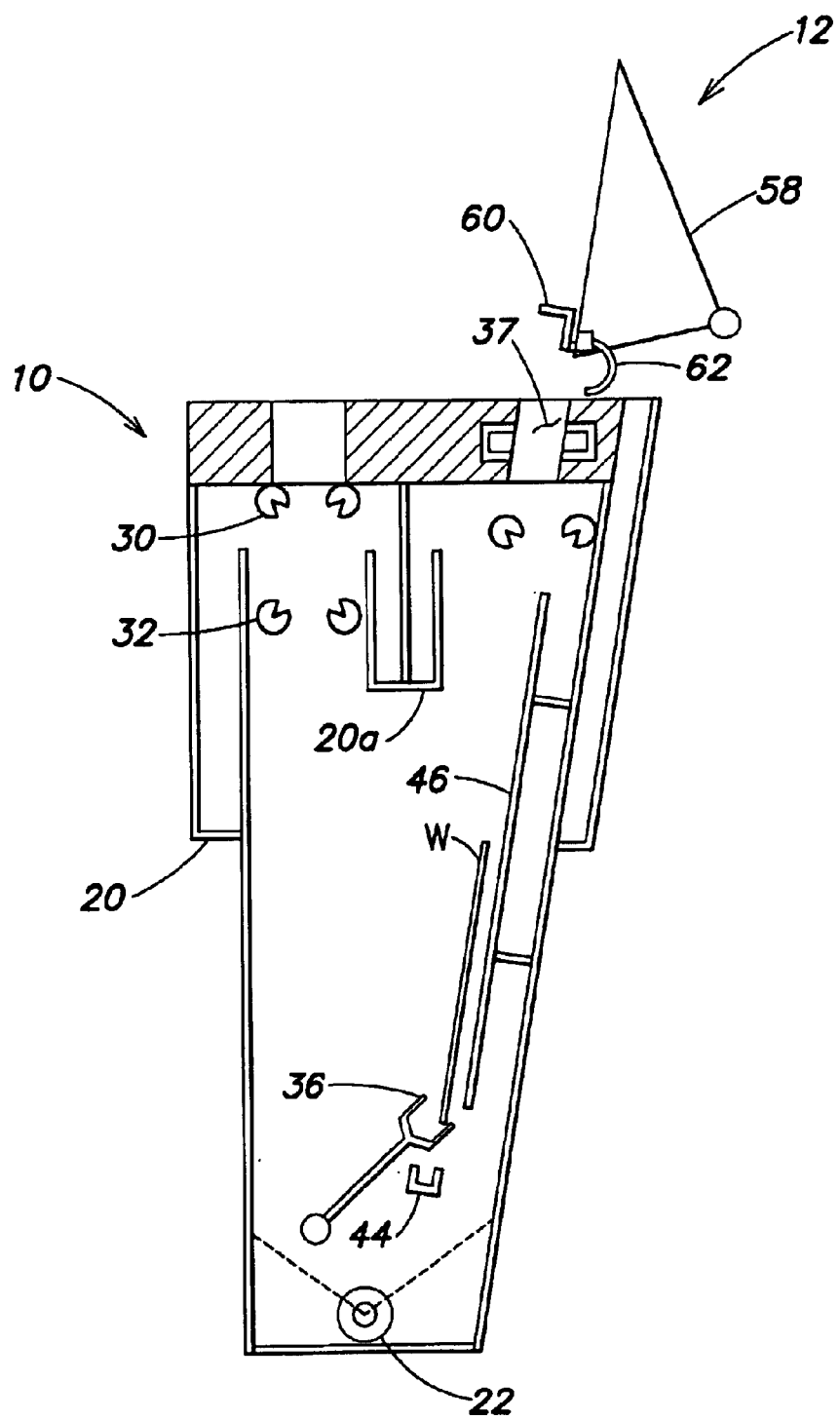
Figure 2D:
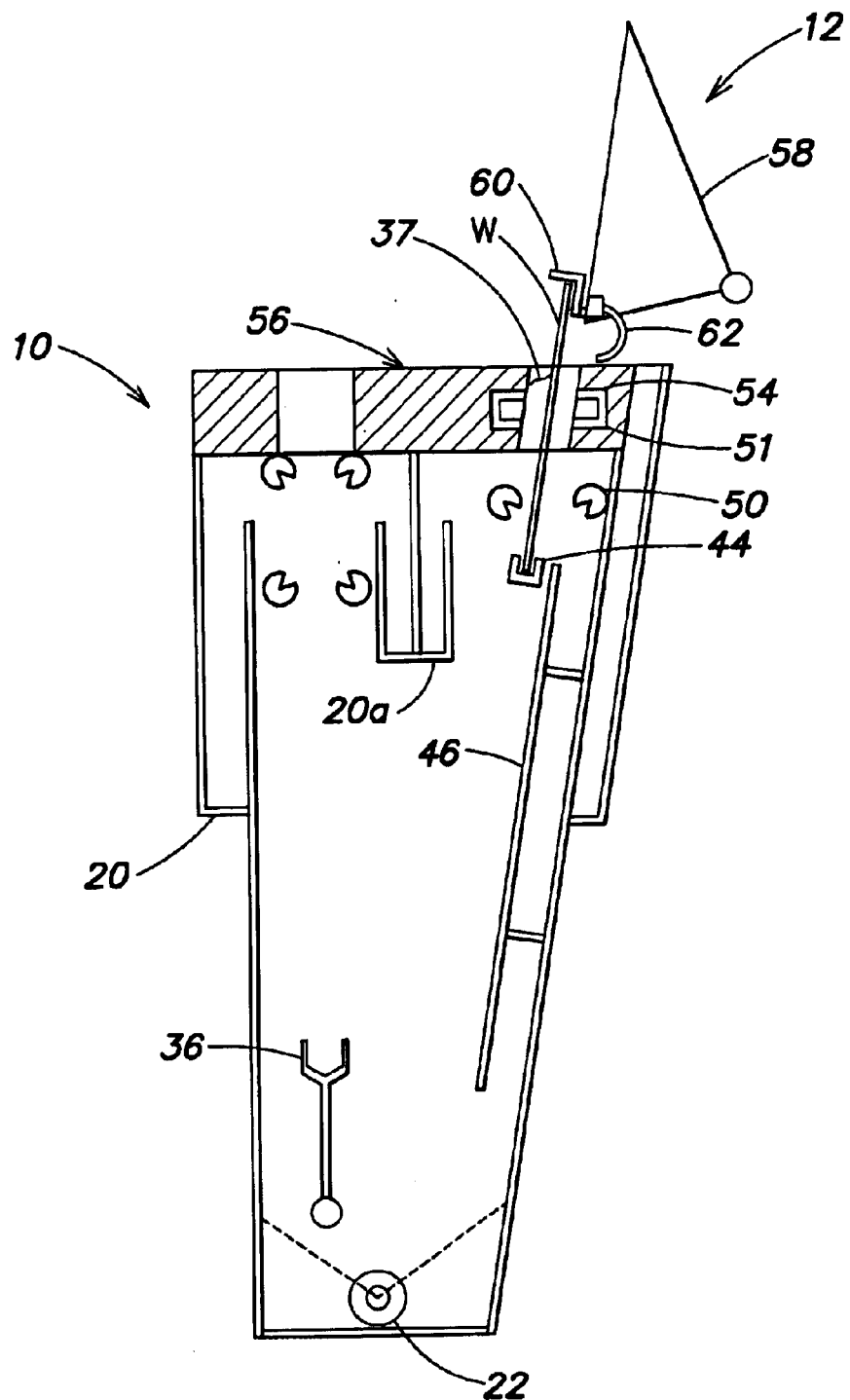
Figure 2E:
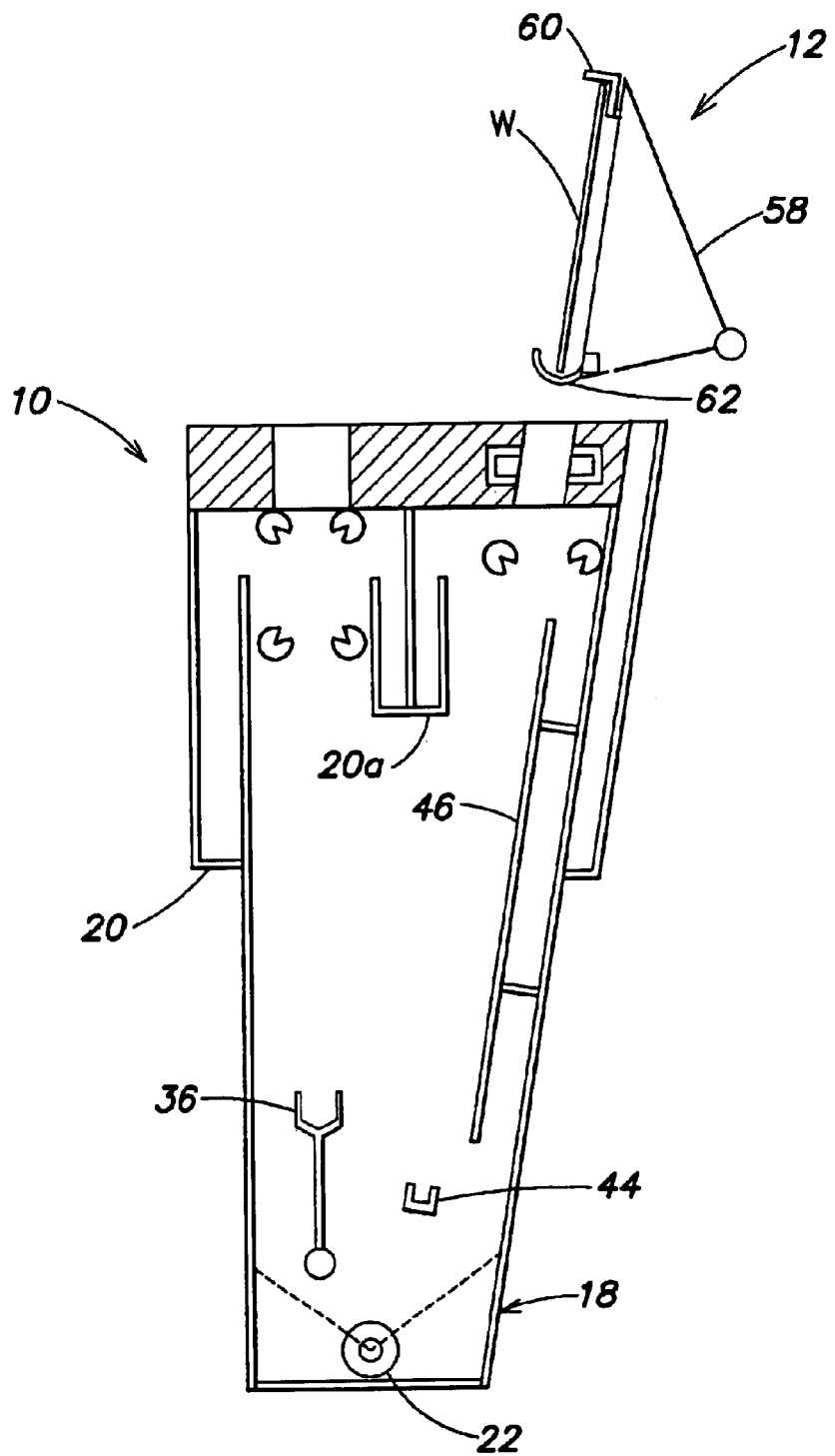

The cradle 36, located at or near the bottom of the submersion tank 18a, transfers the wafer from the rinsing section 26 to the drying section 28. During this transfer the wafer remains submerged in the fluid. Thus the cradle 36 rotates from a vertical position, for receipt of the wafer, to an inclined position (e.g., 9° incline), for wafer elevation through the drying section 28 (FIG. 2C).

The wafer W is then lifted, via the pusher 44, toward the unload port 37 with a lifting velocity profile that lifts at a process speed (e.g., 10 mm/sec) from a time when the top of the wafer emerges from the tank fluid (and the drying vapor spray is initiated) until a time when the wafer's lower edge (e.g., the lower 30–40 mm of the wafer) emerges from the tank fluid. While the lower edge of the wafer emerges from the tank fluid and passes through the drying vapor, the wafer is lifted at a slower speed (e.g., less than 5 mm/sec.) because the lower portion of the wafer is more difficult to dry (due to the wafer's curvature). After the entire wafer has been dried, the wafer may be lifted at a faster speed (e.g., greater than 10 mm/sec.) to a transfer position. As the wafer is lifted, the wafer edges lean by the force of gravity, on the two parallel inclined guides 46, which are submerged in the fluid.

As the wafer W is lifted out of the fluid, the pair of spray mechanisms 50 (FIG. 2D) spray an IPA vapor and nitrogen mixture at the meniscus that forms on both sides of the wafer W. The IPA vapor flow may be directed with or without the help of a flow deflector as described further with reference to FIG. 6. The specific angle of the flow may vary depending upon the type of material on the wafer to be dried.

FIG. 8A is a schematic diagram useful in describing vapor flow angle. With reference to FIG. 8A, flow angle θ of a stream 72 of vapor/carrier gas is measured relative to the water/air interface (and/or a horizontal center line through a nozzle tube 50) as shown. (In one embodiment, a nozzle tube 50 is positioned about 0.5 inches laterally from the wafer W, the flow angle is selected to be about 25° and the nozzle height $H_N$ is selected so that the stream 72 strikes the wafer W at a height $H_V$ of about 3.7 mm above the water/air interface. Other lateral spacings, flow angles, nozzle heights $H_N$ and vapor strike heights $H_V$ may be employed.) A table listing preferred flow angles (measured relative to the water/air interface) for exemplary materials is shown in FIG. 8B. Surface material refers to the material on a wafer that is to be dried. Dry-in or wet-in refer to whether a wafer is dry or wet prior to processing within the drying apparatus 11. Dry-out means that a wafer is dry when removed from the drying apparatus 11. Black Diamond® is a low k dielectric available from Applied Materials, Inc. (e.g., carbon-doped oxide). IPA vapor flow creates a "Marangoni" force resulting in a downward liquid flow opposite to the wafer lift direction. Thus, the wafer surface above the meniscus is dried.

During the drying process, the IPA vapors are exhausted from the processing portion 10 via the exhaust manifold 51, and a flow of nitrogen is directed across the output port 37 (via the nitrogen blanket manifold 54) to deter IPA vapor from exiting the processing portion 10. The gas delivery module (not shown) controls the IPA vapor flow, the exhaust rate and the nitrogen blanket flow rate.

Output Portion—First Aspect

In the embodiment shown in FIGS. 1–2I the output portion 12 includes a platform 58, adapted to rotate between two positions: a processing position (FIG. 2E) for receiving a wafer from the drying section 28 and a FAB interface position (FIG. 2G) for outputting a wafer to a transfer robot. The processing position matches the incline at which the wafer is elevated form the drying section 28, and the processing position is generally horizontal. A motor or other driving mechanism coupled to the output portion 12 drives rotation of the platform 58.

The output portion 12 may include a catcher 60 adapted to move passively with the wafer W. The catcher 60 may be, for example, mounted on a linear ball slide (not shown) that has a stopper at each end. When the platform 58 is in the processing position (e.g., vertically inclined toward the processing portion 10 with the same 9° incline as the inclined guides 46), the catcher 60 moves to the bottom of the linear ball slide due to gravity. This low position may be detected with an optical sensor (not shown). The catcher 60 may contact the wafer at two points that are separated by a distance and that may be closely toleranced to follow the wafers circumference. Accordingly, the catcher 60 may aid in precise wafer positioning.

The output portion 12 may also include a finger 62 adapted to move between a wafer securing position and a wafer passage position. When in the wafer securing position the finger 62 may lock and secure the wafer after the wafer is elevated above the finger 62, thereby allowing the pusher 44 to retract, leaving the wafer held in place on the output portion 12 by the finger 62 and the catcher 60. The finger 62 may be, for example, actuated by an air cylinder (not shown) and equipped with a pair of switches (not shown) to detect the wafer securing and wafer passage positions of the finger 62. An optical sensor (not shown) may also be provided to sense when the wafer is at a sufficient elevation above the finger 62 so that the finger 62 may safely assume the wafer securing position.

Wafer Output—First Aspect

Prior to lifting the wafer W through the drying section 28, the platform 58 is generally vertically inclined (e.g., with a 9° incline) (FIG. 2C). The catcher 60 is at its low position and the finger 62 is in the wafer passage position. As the wafer W exits the drying section 28 (FIG. 2D), it pushes the catcher 60 (e.g., at two points of contact) and causes the catcher 60 to move upward therewith against gravity. The wafer W is thus secured between three points (via the pusher 44 and the catcher 60). When the pusher 44 reaches its high position, the finger 62 is actuated to the wafer securing position so as to secure the wafer W on the platform 58, and the pusher 44 may then retract. (The finger 62 is shown in the wafer securing position in FIG. 2E.) Because the catcher 60 moves passively with the elevating wafer W, wafer rubbing and particle generation during transfer into the output portion 12 may be reduced.

Figure 2F:
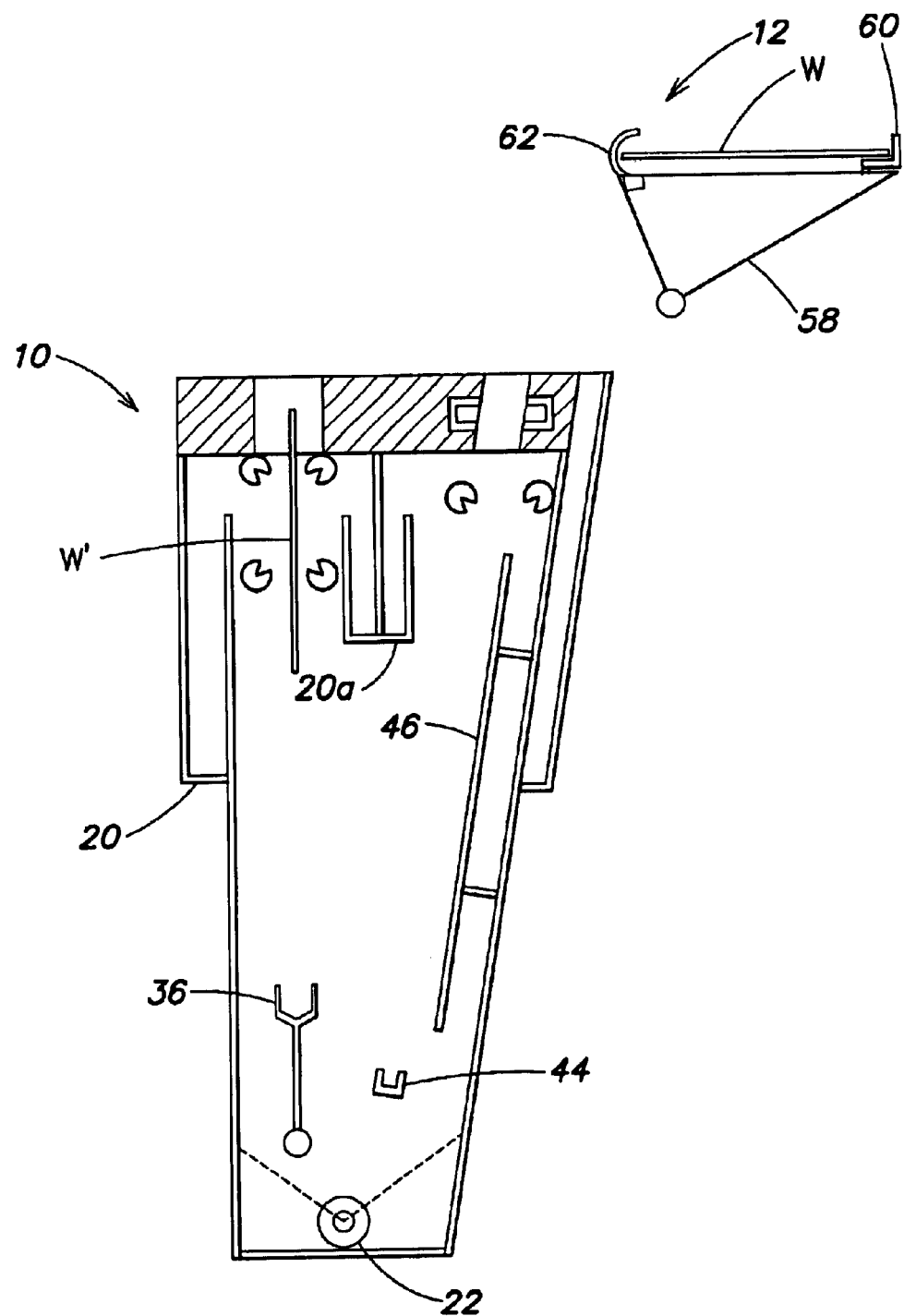
Figure 2G:
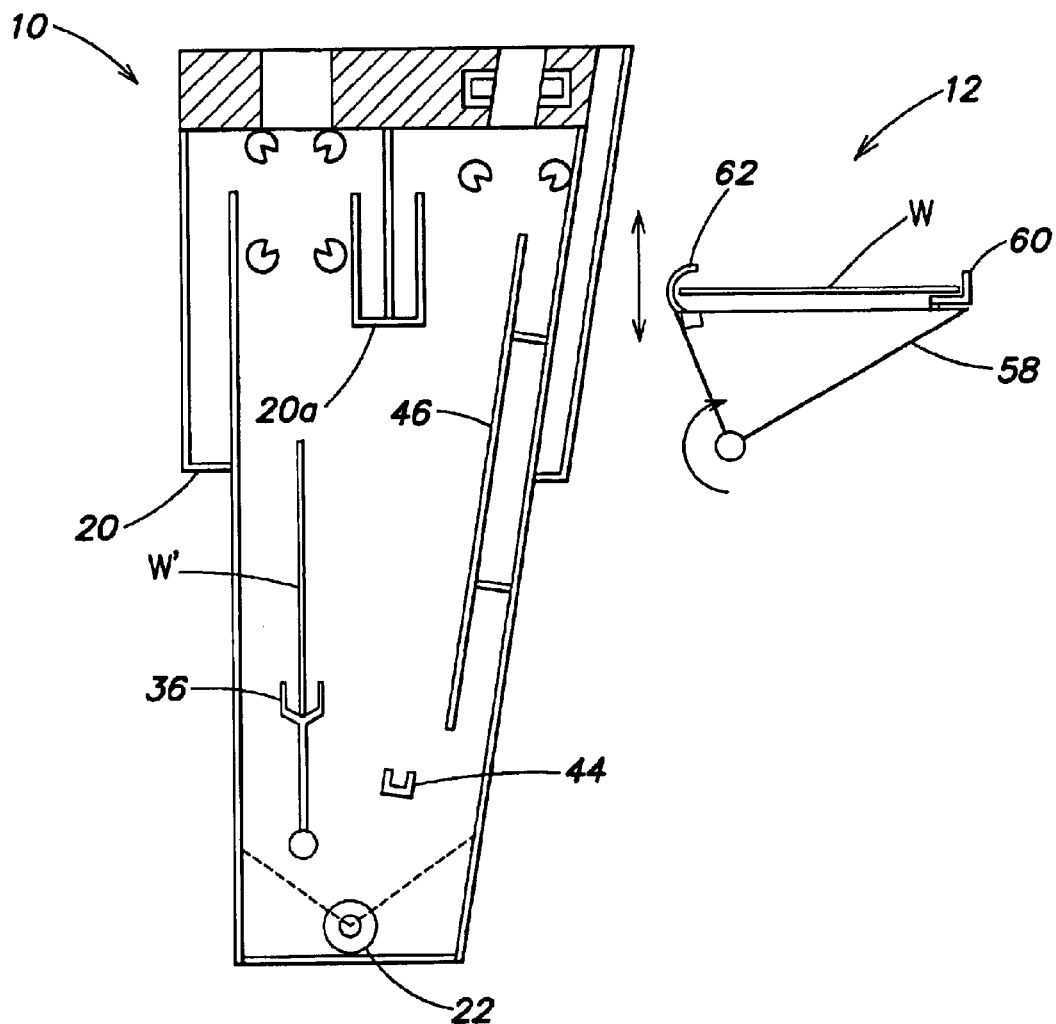
Figure 2H:
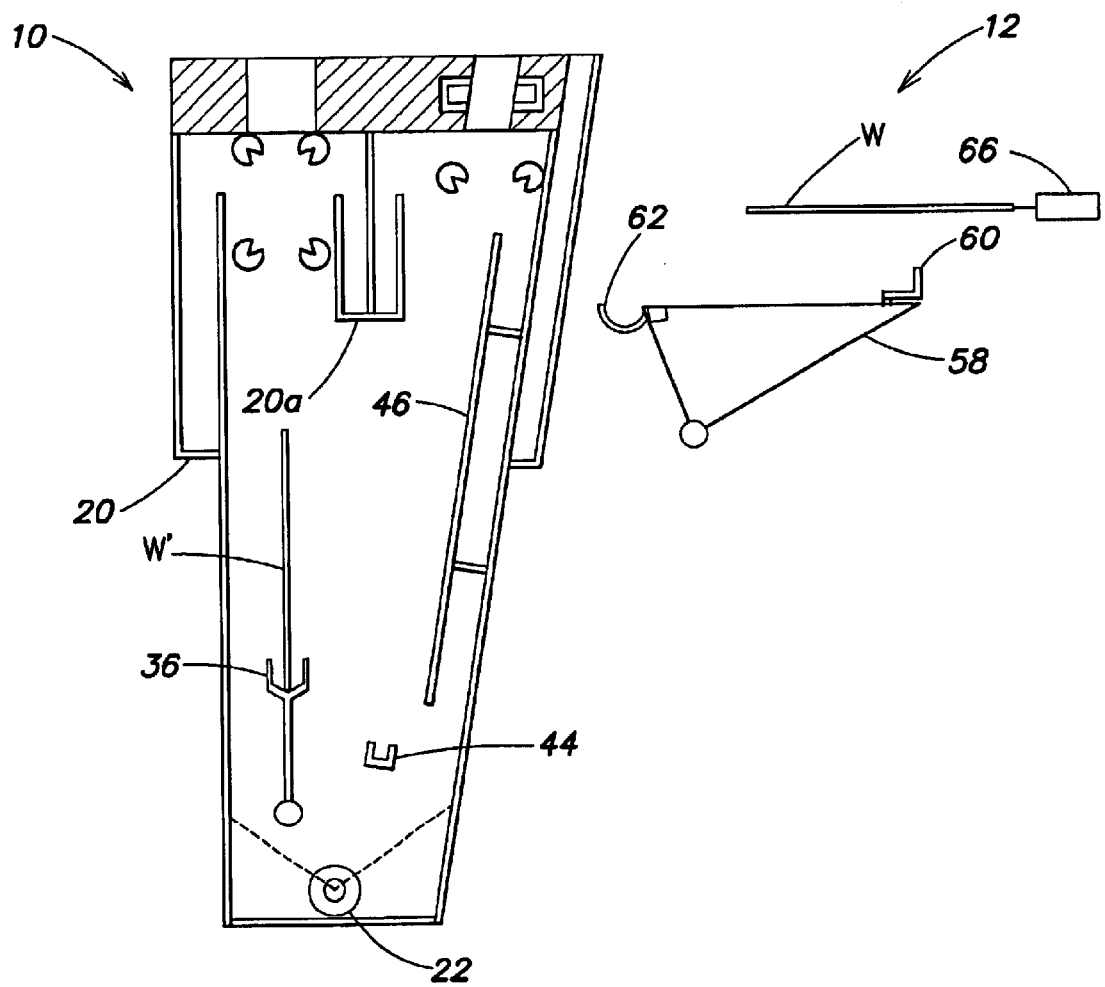
Figure 21:
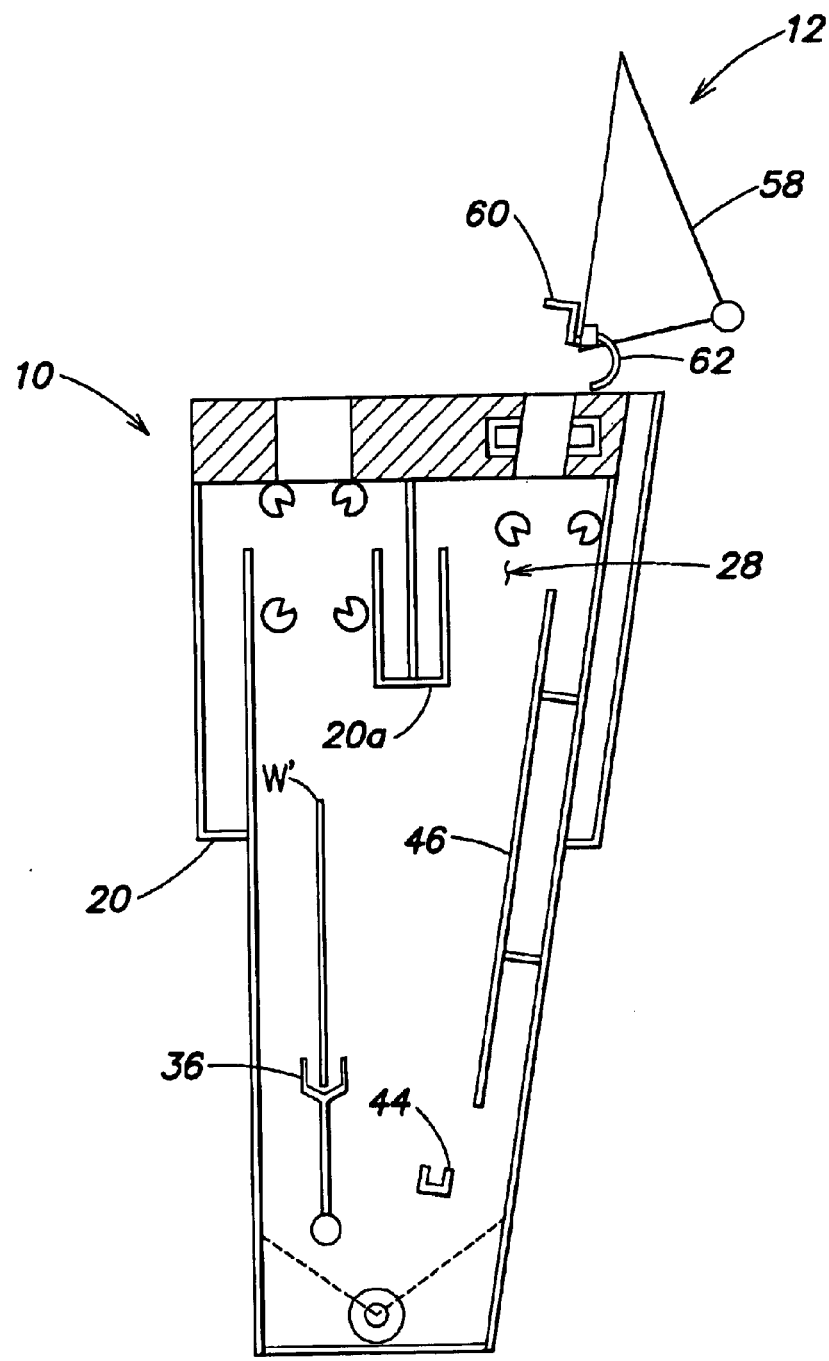

After the wafer W is secured on the platform 58, the platform 58 rotates to its horizontal position (FIG. 2F). An air cylinder 64 (FIG. 1) which may include an adjustable stop and shock absorber (not shown) may be used to lower the platform 58 to a defined output position, for example, at an elevation where a wafer handler 66 (FIG. 2H) may extract the wafer W. The finger 62 is then retracted as shown in FIG. 2H, and the wafer handler 66 picks up the wafer W to transfer it to another location (e.g., to a cassette). The platform 58 then returns to its generally vertically inclined process position (FIG. 2I) ready to receive the next processed wafer W' as the next processing wafer W' when it is elevated from the drying section 28.

In one or more embodiments of the invention, a dedicated gas delivery and exhaust module (not shown) may be employed to deliver isopropyl alcohol (IPA) vapor, nitrogen and exhaust to the drying apparatus 11 (e.g., near the spray mechanism 50). For example, clean, dry air combined with one or more venturis (not shown) may provide the exhaust (e.g., a gas line (not shown) may supply clean, dry air to a pressure port of a venturi mounted near the unload port 42 to provide exhaust).

To provide an IPA/nitrogen flow to the spray mechanism 50, a mass flow controller (not shown) may provide a flow of nitrogen at a predetermined rate to an IPA bubbler (not shown). In at least one embodiment, a 1.4 liter bubbler is employed to deliver an IPA/nitrogen mixture having a concentration of about 5% IPA. Other bubbler sizes and/or IPA concentrations may be employed.

In one particular embodiment of the invention, the bubbler may be equipped with three level sensors: Low, High and Hi—Hi level sensors. The first two level sensors may be used, for example, during an automatic refill of the IPA bubbler. The latter Hi—Hi sensor may be used, for example, as a hardware interlock to prevent overfilling the bubbler. A pressurized supply vessel (not shown), such as a 1-Liter or otherwise appropriately sized vessel, may be employed to automatically refill the bubbler with liquid IPA. The supply vessel may include a low-level sensor and may be automatically or manually refilled when its low-level sensor is triggered.

A nitrogen blanket flow rate (e.g., for preventing IPA vapor from escaping from the processing portion 10) may be controlled with a needle valve or other suitable mechanism. Clean dry air and nitrogen blanket supply lines may each be provided with a flow switch for safety purposes (e.g., hardware interlock flow switches that may be used to shut-off the IPA vapor supply when the exhaust or nitrogen blanket flow are lost). Pressure regulators may be used to control pressure in each supply line.

Output Portion—Second Aspect

Figure 3A:
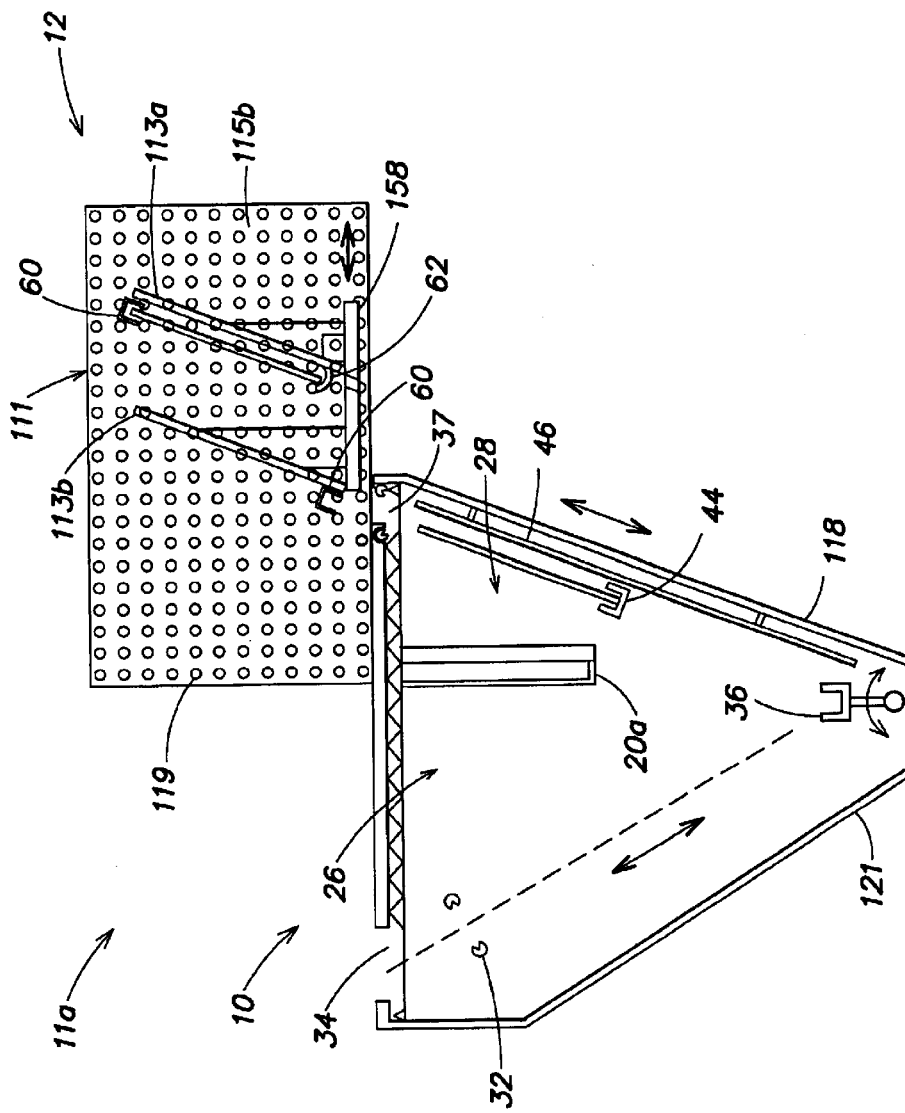
FIGS. 3A–B are a schematic side view and a top plan view respectively showing the drying apparatus of FIG. 1 wherein the output portion is configured according to a second aspect.
Figure 3B:
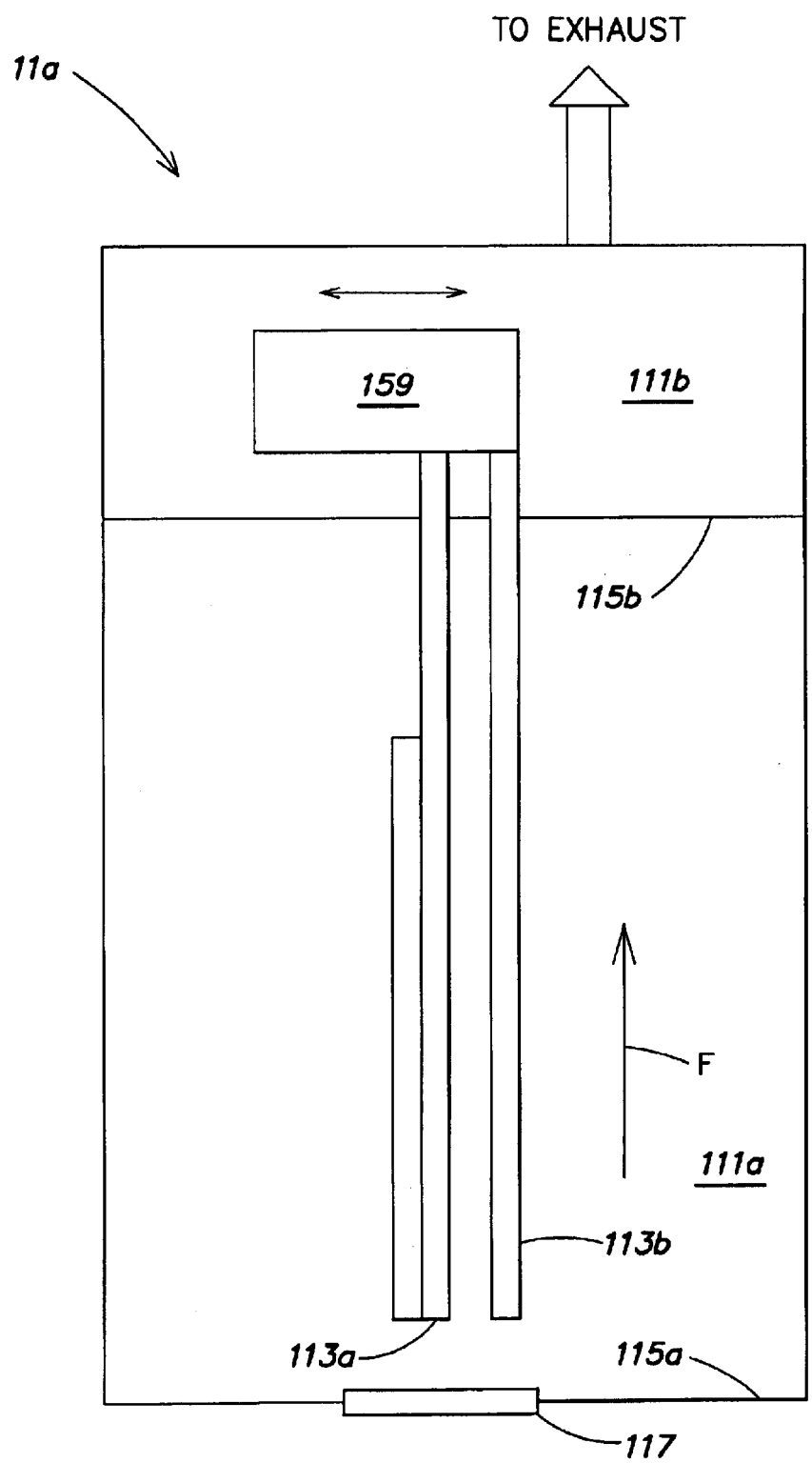

FIGS. 3A–B are a schematic side view and a top plan view, respectively, of a second embodiment of the output portion 12 of the inventive drying apparatus. The inventive apparatus 11a of FIGS. 3A–B includes an enclosure 111 that surrounds the output portion 12. A translatable platform 158 of the output portion 12 may include two or more wafer receivers 113a, 113b, each comprising the catcher 60 and the finger 62 described with reference to FIGS. 1–2I. In this embodiment the translatable platform 158 is adapted to move horizontally (e.g., via a lead screw, pneumatic cylinder, motor or the like), so that the wafer being elevated from the drying portion 28 may be received by either the first or second wafer receiver 113a, 113b. In this manner wafer throughput may be maximized, as a first wafer may be held at the first wafer receiver 113a for pick up by a wafer handler (not shown) while a second wafer is being output to the second wafer receiver 113b, or vice versa.

The enclosure 111 has a first side wall 115a which may be positioned adjacent a transfer robot (not shown). The first side wall 115a has an opening 117 through which the transfer robot may extract wafers. The enclosure 111 may also have an internal partition wall 115b positioned opposite the first side wall 115a, for dividing the enclosure 111 into two chambers 111a, 111b. The first chamber 111a may enclose the translatable platform 158 with sufficient space to allow the translatable platform to translate back and forth so as to receive a wafer at either the first or second wafer receivers 113a–b. The second chamber 111b may enclose the mechanisms employed to translate the translatable platform 158, as well as any other moving parts (represented generally by reference numeral 159 in FIG. 3B). Such an internal partition wall 115b, that separates the two chambers may have a plurality of small openings 119 (FIG. 3A) that preferably cover the entire internal partition wall 115b. When the region adjacent the transfer robot is maintained at a higher pressure than the region adjacent the inventive drying apparatus 11a, air may flow laminarly in the opening 117, across the first and second wafer receivers 113a, 113b (parallel to the wafers' major surface as indicated by arrow F) and through the small openings 119 into the second chamber 111b. The second chamber 111b may be exhausted via an exhaust system not shown.

In addition, an exhaust line (not shown) located beneath the output portion 12 maintains an acceptable vertical laminar flow through the output portion 12, and also dilutes any IPA vapors that escape from the drying section 28. The enclosure 111 of the output portion 12 acts as an additional containment mechanism for preventing IPA vapor from entering the atmosphere surrounding the drying apparatus 11a.

In order to allow a wafer to be output to the first wafer receiver 113a without blocking the processing portion 26 of the main tank 118, a front wall 121 of the main tank 118 (i.e., the front wall of the processing portion 26) may be angled (e.g., 9°), as shown in FIG. 3A. By angling the front wall of the processing portion 26, the load port 34 is able to be located far enough from the output port 37 so as to avoid blockage by the output enclosure 111, yet the fluid volume of the processing portion 10 is not increased as much as it would be if a straight front wall were employed. In embodiments that employ such an angled front wall the cradle 36 may be adapted to elevate to a position near the load port 34, such that a wafer handler may place a wafer on the elevated cradle 36. Such an elevating cradle 36 allows for use of a wafer handler that does not have the ability to rotate so as to match the angle between the load port 34 and the bottom of the processing portion 10. The elevatable cradle 36 may be coupled to a guide located along an inside surface of the angled front wall, and may magnetically coupled through the front wall to an external actuator, and thus may operate similarly to the elevatable pusher 44.

Wafer Output—Second Aspect

Figure 4A:
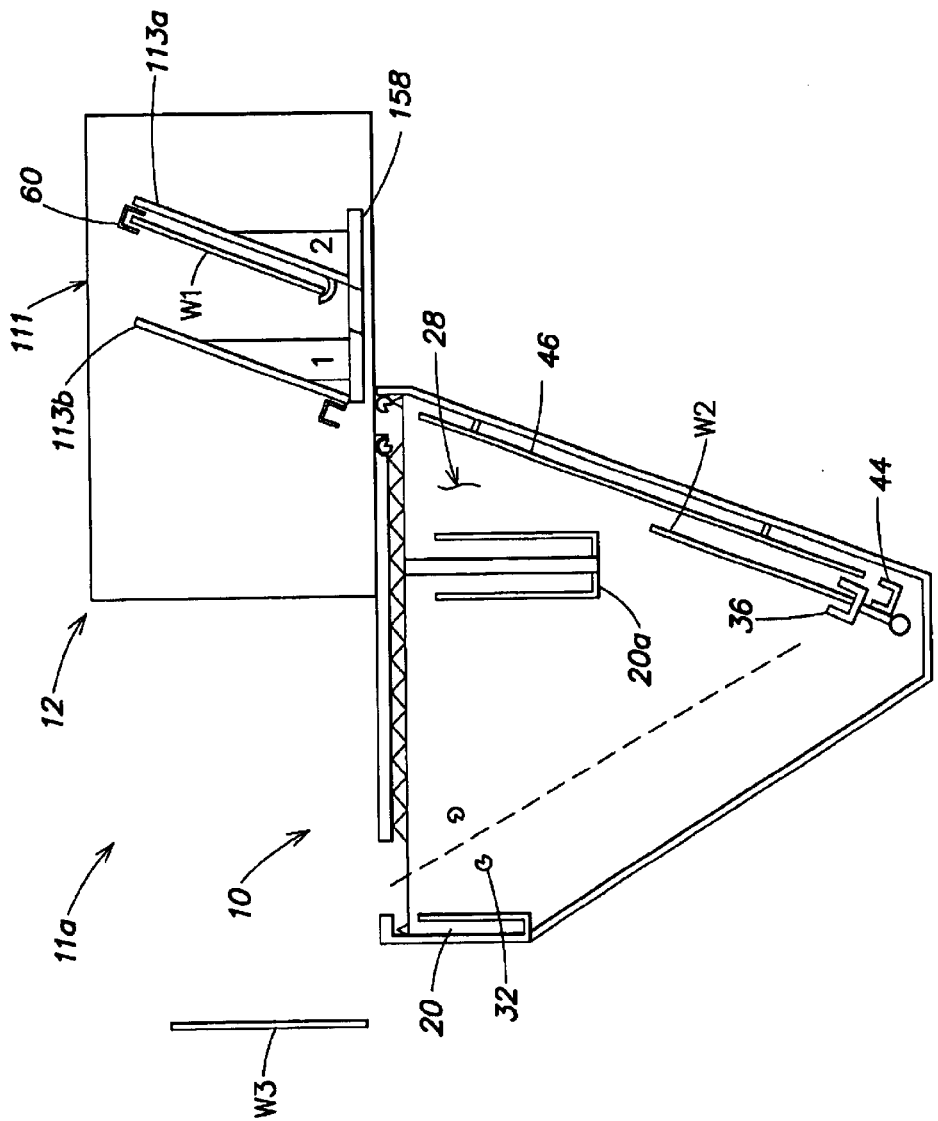
Figure 4B:
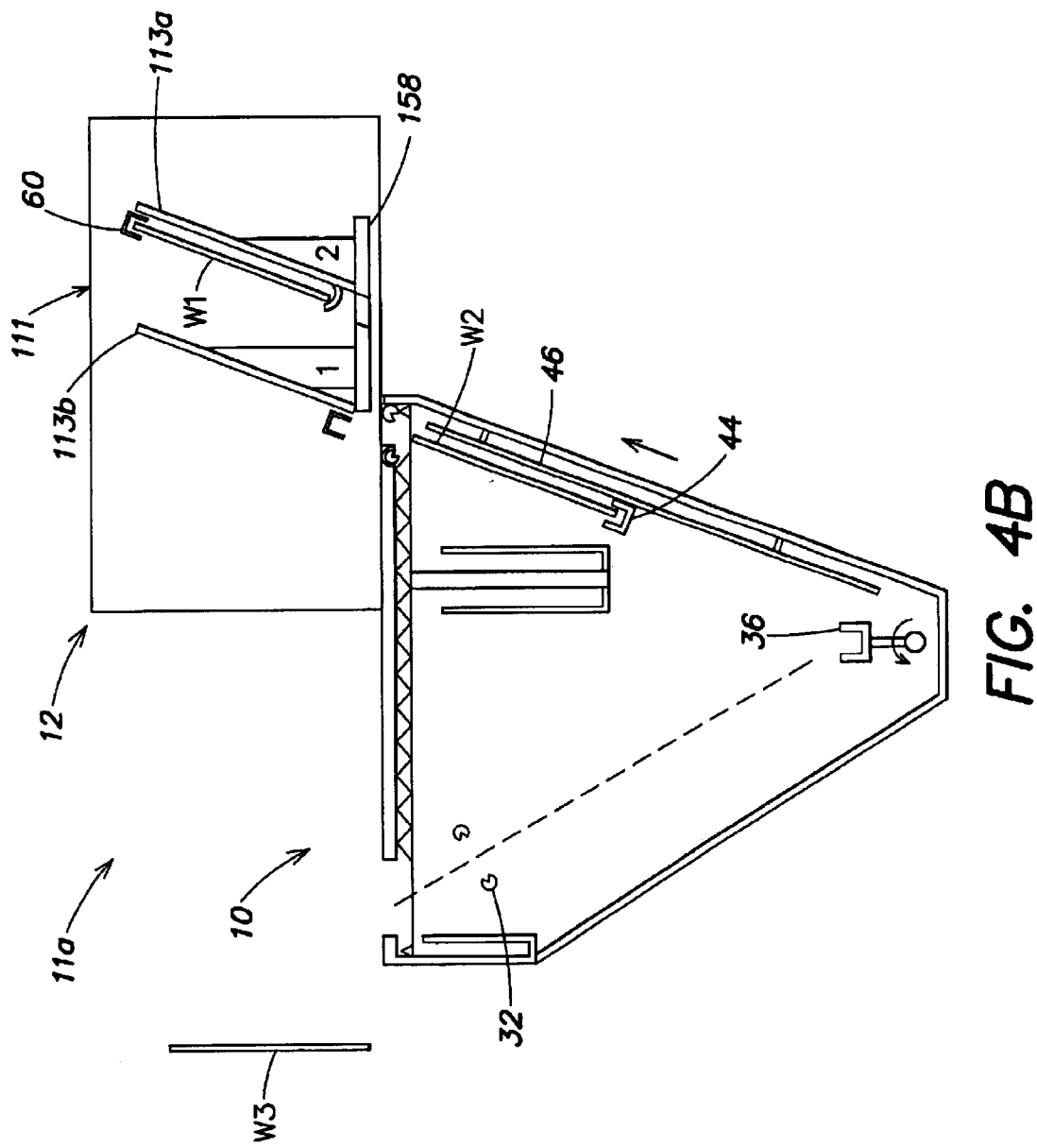

FIGS. 4A–I are schematic side views that show a wafer at various stages of processing within the alternative apparatus 11a of FIGS. 3A–B. As shown in FIG. 4A wafer W1 is positioned on wafer receiver 113a of output platform 158 and output platform 158 is in its right-most position with the second wafer receiver 113b positioned to receive the next wafer output from the drying section 28. A wafer W2 is positioned on the submerged cradle 36 and the pusher 44 is in positioned below the cradle 36. In FIG. 4B the pusher 44 has elevated (e.g., through a slot or opening in the cradle 36) so as to lift the wafer W2 from the cradle 36, and the cradle 36 has rotated back to a vertical position.

In FIG. 4C the pusher 44 has reached the elevation where the wafer W2 passes through the unload port 37 and the top edge of the wafer W2 contacts the catcher 60. As the wafer moves into the unload port 37 the IPA vapor spray, the nitrogen blanket and the exhaust are initiated. Also in FIG. 4C the cradle 36 has elevated and is positioned inside the load port 34 ready to receive the next incoming wafer.

Figure 4D:
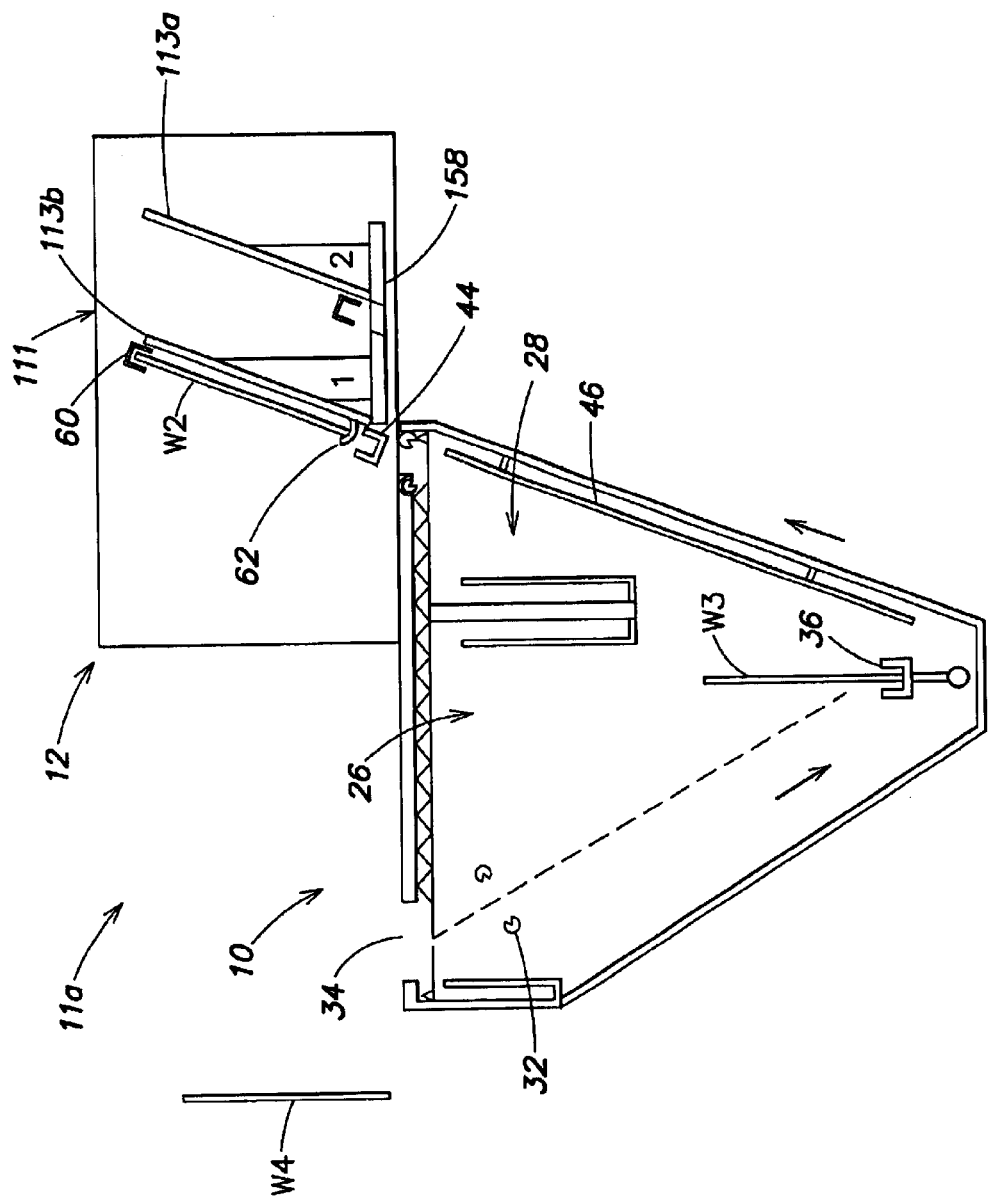

As shown in FIG. 4D the first wafer W1 has been extracted from the first wafer receiver 113a of the enclosure 111 and the catcher 60 has returned to the lowered position. The second wafer W2 has been elevated onto the second wafer receiver 113b to an elevation above the finger 62, the finger 62 has moved into positioned below the second wafer W2 and the pusher 44 has lowered and is no longer supporting the second wafer W2 which is now held between the finger 62 and the catcher 60. A third wafer W3 has been loaded onto the cradle 36 and the cradle 36 has lowered to the bottom of the processing portion 10. Note that as the third wafer W3 lowers through the load port 34 in may be sprayed by submerged nozzles 32 and/or by unsubmerged nozzles 30 (not shown).

Figure 4E:
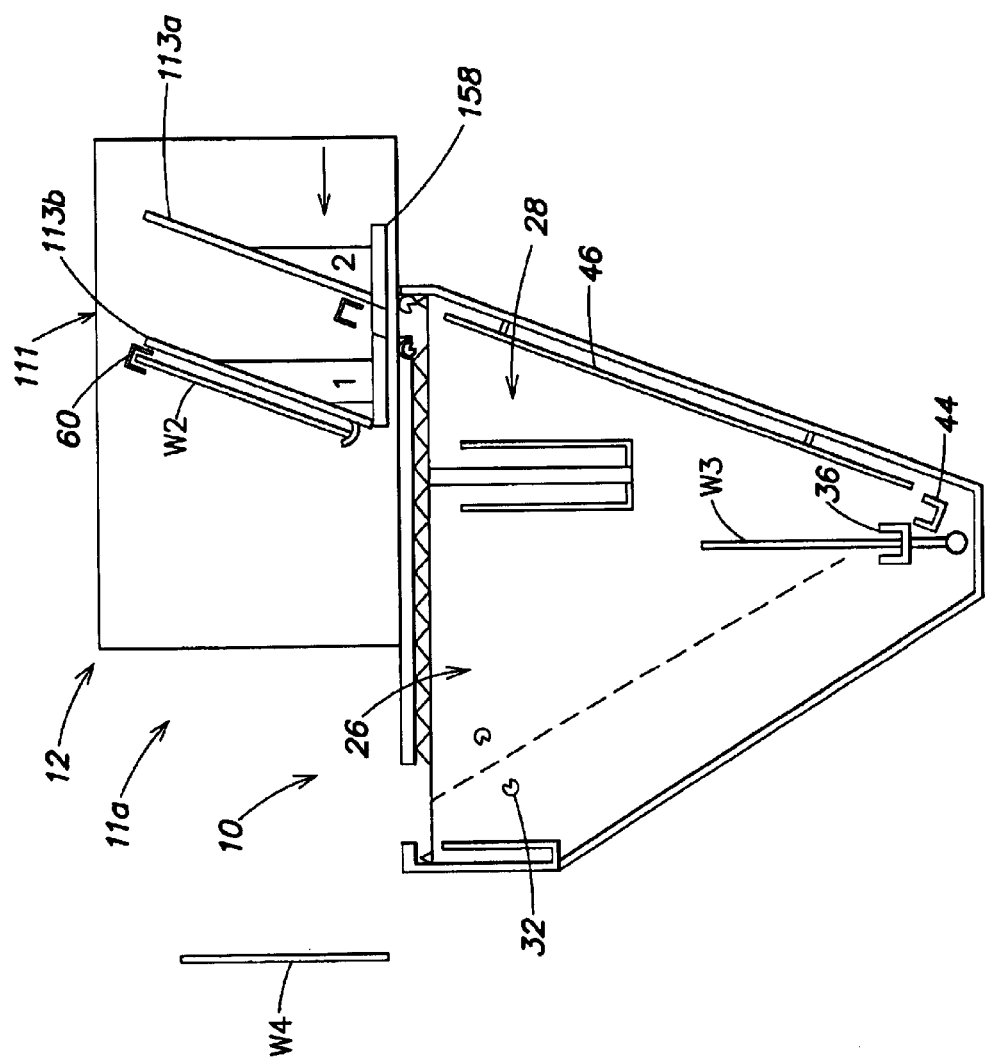

As shown in FIG. 4E the platform 158 has moved to its left-most position such that the first wafer receiver 113a is in position to receive the next wafer output from the drying section 28. The pusher 44 has lowered to a position below the elevation of the cradle 36 and the cradle 36 is beginning to rotate the third wafer W from the rinsing portion 26 to the drying portion 28.

As shown in FIG. 4F the cradle 36 has rotated to position the third wafer W3 in the drying portion 28 and the upper portion of the third wafer W3 is resting on the wafer guides 46.

Figure 4G:
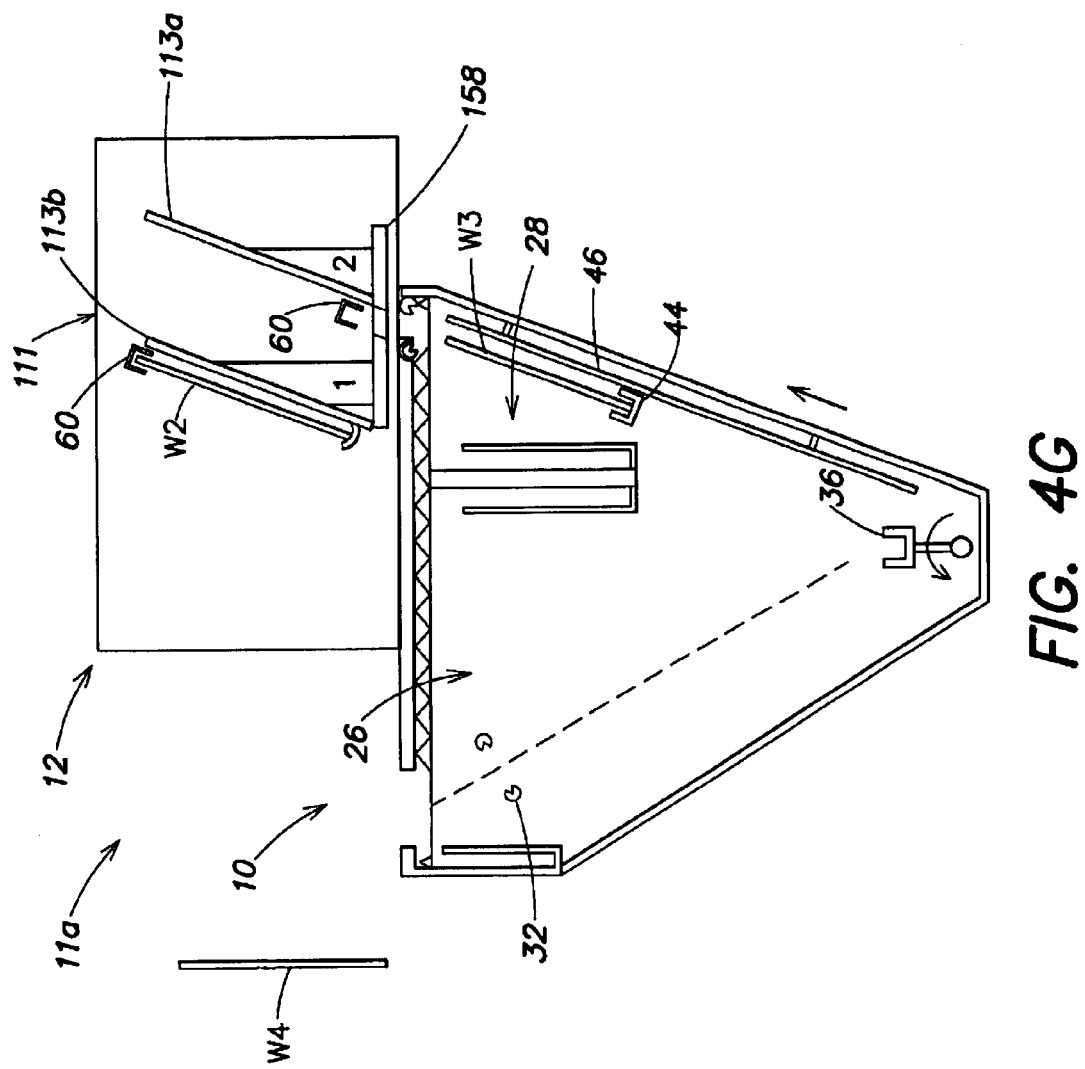

As shown in FIG. 4G the pusher 44 has elevated, lifting the third wafer W3 off of the cradle 36 and the cradle 36 has rotated back to a vertical position.

Figure 4H:
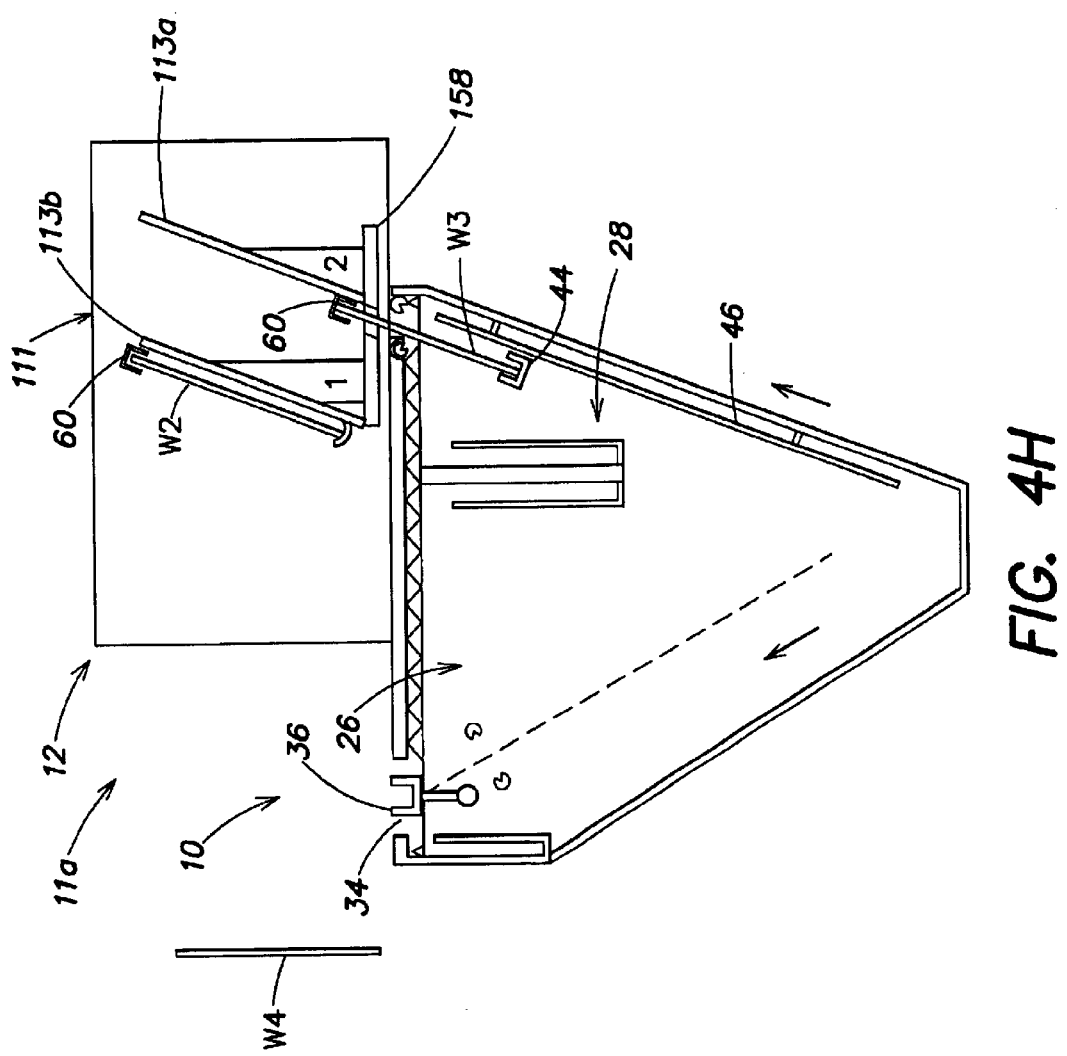

As shown in FIG. 4H the pusher 44 begins to lift the third wafer W3 through the IPA vapor spray and through the nitrogen blanket, to a position where the top of the third wafer W3 contacts the catcher 60 of the first wafer receiver 113a. The cradle 36 has elevated to position itself within the load port 34, ready to receive the next incoming wafer.

As shown in FIG. 4I the second wafer W2 has been extracted from the second wafer receiver 113b of the output enclosure 111 and the catcher 60 has returned to its lowered position. The third wafer W3 has been elevated onto the first wafer receiver 113a to an elevation above the finger 62, the finger 62 has moved into positioned below the third wafer W3 and the pusher 44 has lowered and is no longer supporting the third wafer W3, which is now held between the finger 62 and the catcher 60. A fourth wafer W4 has been loaded onto the cradle 36 and the cradle 36 has been lowered to the bottom of the rinsing portion 10. Note that as the fourth wafer W4 lowers through the load port 34 it may be sprayed by submerged nozzles 32 and/or by unsubmerged nozzles (not shown).

Processing Portion—Second Aspect

FIG. 5 is a side schematic view of an inventive drying apparatus 211 showing only the processing portion 10 thereof. The processing portion 10 is configured according to a second aspect of the present invention. Specifically, rather than a main chamber that submerges a wafer (such as submersion chamber 18a of FIGS. 1–2I), in the second aspect of the invention the main chamber sprays an unsubmerged wafer with fluid both to rinse and/or maintain the wetness of the wafer in the rinsing chamber 226, and sprays the unsubmerged wafer with fluid to create the fluid meniscus (for Marangoni drying) in the drying chamber 228. Only minor hardware differences exist between a processing portion configured for submersion and a processing portion configured for spray processing.

As can be seen with reference to FIG. 5, the overflow weirs 20 and 20a of FIGS. 1–2I may be omitted. Preferably, a pair of spray nozzles 30 are positioned to spray fluid to both the front and back surfaces of a wafer as the wafer enters through the load port 34. In the embodiment of FIG. 5 the separation wall 24 deters fluid spray from splashing from the rinsing portion 226 into the region above the fluid nozzles provided in the drying portion 228 (and thus deters inadvertent rewetting of a dried wafer). Within the drying portion 228, an additional fluid supplying spray mechanism 50a is provided below the IPA supplying spray mechanisms 50.

In operation an incoming wafer is sprayed with a fluid such as deionized water which may or may not include a surfactant or other cleaning chemistry such as Applied Materials' ElectraClean™ solution so as to rinse and/or maintain the wetness of the wafer. As the wafer exits the drying portion 228 the wafer is sprayed with a fluid such as deionized water with or without a surfactant or another cleaning agent. This exit fluid spray forms a uniform fluid meniscus across the wafer. The IPA spray mechanism 50 sprays IPA vapor to the meniscus thereby creating a Marangoni flow that dries the wafer. Note that wafer transfer within the processing portion 10, and wafer output to the output portion 12 may be as described with reference to FIGS. 1–4I.

Flow Deflector

Figure 6:
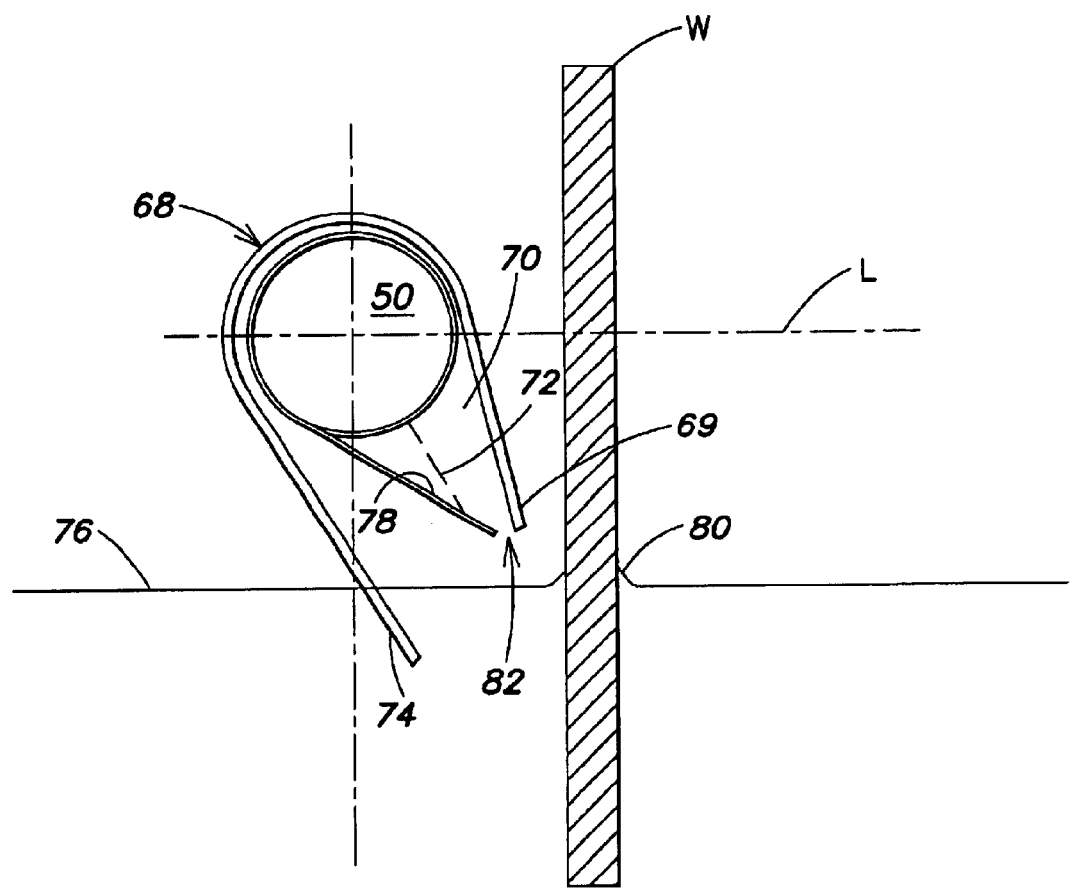
FIG. 6 is a schematic side view of a vapor flow deflector that may be installed in association with a vapor nozzle in a drying apparatus.

The efficiency of the delivery of IPA vapor to the wafer/air/water interface (i.e., the meniscus) may be improved by installing a vapor flow deflector in association with each IPA vapor delivery nozzle/tube 50. One such arrangement is schematically illustrated in FIG. 6. To simplify the drawing, a nozzle tube 50 (which may comprise the tube 50 described above) and flow deflector 68 are shown only on one side of the wafer W, although in practice a nozzle tube 50 and flow detector 68 may be provided on each side of the wafer W. Also the wafer W is shown as exiting normal to the surface of the water 76, although the wafer W may exit the surface of the water 76 at an incline (e.g., approximately 9° from normal, although other angles may be employed).

In one embodiment of the invention, the flow deflector 68 may take the form of a two part sleeve adapted to fit around the nozzle tube 50. A first part 69 of the flow deflector 68 defines a wedge-shaped space 70 into which a stream 72 of IPA vapor (e.g., mixed with a carrier gas such as nitrogen) is sprayed and is designed to direct the stream 72 at a specific angle relative to, for example, a horizontal line L drawn through the center of the nozzle tube 50 and parallel to the water surface. The second part (e.g., a lower wing 74) of the flow deflector 68 may dip below the surface of the water 76 to limit the volume of water exposed to the IPA vapor. The stream 72 of IPA vapor is preferably angled downwardly, as illustrated in FIG. 6 so as to impinge on the inner surface 78 of the first part 69 of the flow deflector 68. The stream 72 of IPA vapor may then be reflected (not shown) by inner surface 78 to the meniscus 80 formed at the wafer/air/water interface. In one or more embodiments, the angle between the IPA stream 72 and the inner surface 78 does not exceed 45°, although the angle of the IPA stream 72 preferably is selected so that IPA vapor strikes the meniscus 80 within a desired angular range (as described below with reference to FIGS. 8A–B) and/or with a desired flow velocity to optimize IPA vapor delivery to the meniscus 80.

In one exemplary embodiment, the flow deflector 68 has a slit opening 82 that may have a width of 0.05 inches and may be spaced, for example, 0.10 inches above the surface of the water 76, and 0.10 inches away from wafer W so as to efficiently deliver IPA to the meniscus 80. Other slit opening widths, distances above the surface of the water 76 and/or distances from the wafer W may be employed. The flow deflector 68 may be aimed at an angle of 45° relative to the surface of the water 76, however other angles may be employed. Preferably the slit opening 82 is aimed so as to point just below the meniscus 80.

The flow deflector 68 serves to limit the volume of water exposed to IPA vapor, thereby reducing waste and consumption of IPA, improving dryer efficiency and performance, and reducing safety risks. In one embodiment, the range of water volume exposed to IPA is about 0–12 milliliters for a 300 mm wafer and about 0–8 milliliters for a 200 mm wafer although other ranges may be employed.

If no flow deflector 68 is employed, the stream 72 of IPA vapor may impinge the surface of the water 76 at an angle in the range of 22°–30° which has been found to be suitable for drying several different types of films formed on a wafer. Other impingement angles may also be employed. The flow deflector 68 may be constructed from a single piece of material, or may comprise more than two parts. The flow deflector 68 may be formed from stainless steel or another suitable material.

Reduced Concentration IPA Mixture

Figure 7:
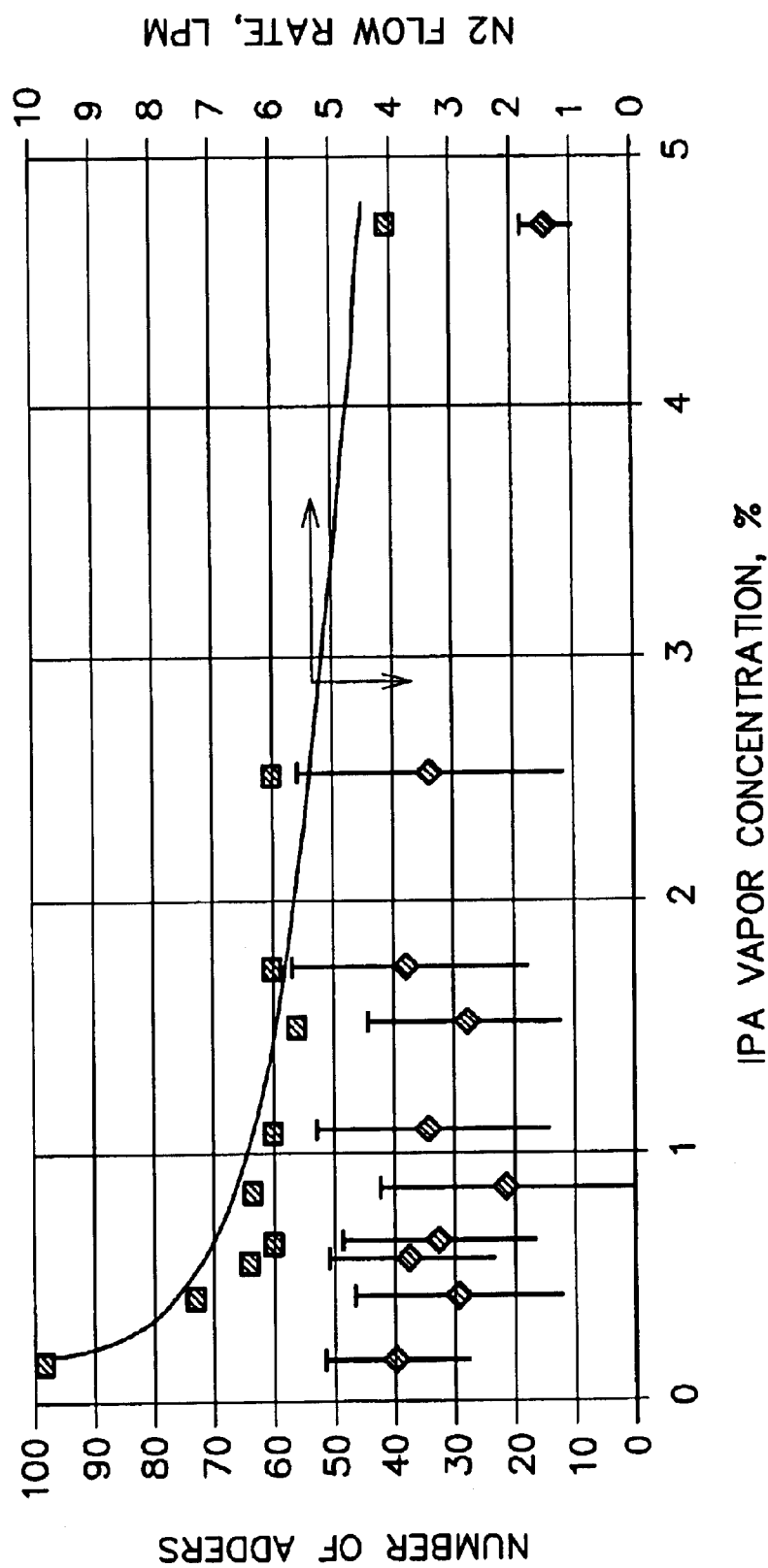
FIG. 7 is a graph which plots the number of particles observed on wafers dried via various IPA concentrations and various flow rates.

The safety and efficiency of the cleaning/drying module can be further improved by reducing the concentration of IPA vapor in the IPA/carrier gas mixture (e.g., to 0.2% or less) while increasing the flow rate of the mixture (e.g., to at least 2–3 liters per minute and preferably about 5 liters per minute). The increased flow rate compensates for the low concentration of IPA and allows for highly efficient and low defect drying with a high drying rate (e.g., 10 mm/sec, resulting in a drying time of 20 seconds for a 200 mm wafer assuming a constant wafer lifting speed). FIG. 7 is a graph which plots the number of particles larger than 0.12 microns (so called "adders" in FIG. 3) observed on wafers dried by gas (nitrogen) having various IPA concentrations and various flow rates. Results may also vary depending on nozzle diameter, nozzle spacing from wafer surface, use of and angle of flow deflectors, etc. Experimental data shows that for a carrier gas flow rate of 5 liters per minute, the number of defects on silicon and on low k dielectric containing wafers does not increase when the concentration of IPA vapor is reduced from 1 percent to 0.2 percent.

As previously noted, the wafer lifting speed may be reduced when the lower portion of the wafer W is being dried. Similarly, the IPA concentration in the IPA/carrier gas mixture may be increased and/or the flow rate of the IPA/carrier gas mixture may be increased when the lower portion of the wafer W is being dried. It will be understood that other inert gases can be employed instead of nitrogen. Also, it will be understood that IPA can be replaced with other organic vapors conventionally used for Marangoni drying, etc.

While the present invention has been disclosed in connection with the preferred embodiments thereof, it should be understood that other embodiments may fall within the spirit and scope of the invention. Particularly, it will be apparent that the inventive lifting profile, and the inventive IPA deflector can be used within any drying system, and are not limited to use within the system disclosed. Similarly, the use of spray nozzles (underwater and/or above the water/fluid bath) to rinse a substrate as it enters a rinsing tank may be employed in systems other than those disclosed herein. A module having an angled wall with angled wafer guides for outputting a wafer in a known orientation is considered inventive, as is a passive output catcher. Further inventive features include a method and apparatus for transferring a wafer (particularly a submerged wafer) from a first angle, to a second angle, and a module adapted to transfer the wafer from one angle to the next so as to move the wafer from alignment with an input port, to alignment with an output port. Accordingly, it will be understood that the embodiments described herein are merely exemplary, and an inventive apparatus may employ one or more of the inventive features.

Some of the inventive features which may be employed individually are as follows:

- a module that combines a rinsing section and a drying section without having the rinsed wafer surface exposed to air;
- a rinsing section equipped with submerged and/or overhead spray nozzles for better removal of surfactant and process tank particles (the overhead sprays providing the most aggressive rinsing);
- a main tank with two sections to separate the loading and unloading ports;
- tubes, nozzles and/or flow deflectors that precisely deliver IPA vapor (e.g., to the tip of the meniscus) to minimize IPA consumption;
- IPA spray tubes that can be precisely oriented at the best angle for supplying IPA to the meniscus; (see U.S. Patent Application Serial No. 60/273,786 filed Mar. 5, 2001, titled Spray Bar, the entire disclosure of which is incorporated herein by this reference);
- a friction-free guide mechanism that employs a "catcher" mounted on the output station;
- a cradle that simplifies the underwater wafer transfer from the rinsing section to the drying section;
- a variable speed pusher having a lift velocity profile;
- slanted back wall and/or slanted front wall;
- internal overflow weir for tanks having separate input and output ports;
- the enclosed output with laminar air flow;
- a deflector that limits the surface area of fluid exposed to the drying (e.g., IPA) vapor;
- exhaust employing venturi for diluting organic solvent concentration;
- the use of a drying gas mixture having reduced concentration of organic solvent and increased flow rate;
- a plurality of output wafer supports for at least partially simultaneous output from dryer and pick up by a robot; and
- a module having a rinsing section and a section adapted for Marangoni drying, both of which employ spray mechanisms rather than wafer submersion.

Compared to a conventional SRD, the inventive apparatus 11 may provide superior performance and a wider process window for drying both hydrophobic and hydrophilic wafer surfaces. The novel drying technique based on the "Marangoni" principle may, in one example, leave only a 3 nm thick layer for evaporation as compared to a 200 nm layer which may be left by conventional SRDs. By combining the process module with the output station, the inventive apparatus may achieve a fast drying speed that may lead to a high throughput for a wide variety of different films. The rinsing section spray nozzles also may be capable of removing surfactant that may be applied to hydrophobic wafers during scrubbing and transfer to the drying module.

It should be noted that the nitrogen blanket is merely exemplary, and a blanket of any inert gas or air or plurality of gases (including air) can be employed to form a blanket across the output port and then to deter drying vapors from escaping from the apparatus. Also, it should be noted that IPA vapor is merely exemplary, and other vapors or gases that are miscible with the fluid (that is applied to the drying section) so as to create a Marangoni flow that dries the wafer surface may be similarly employed. Accordingly, such vapors or gases will be referred to herein as drying gases. The terms "catcher," "finger" and "cradle" as used herein are not intended to be limited to any specific shape or structure, but rather refer generally to any structure that functions as do the catcher, finger and cradle described herein.

Accordingly, while the present invention has been disclosed in connection with the preferred embodiments thereof, it should be understood that other embodiments may fall within the spirit and scope of the invention, as defined by the following claims.

The invention claimed is:

1. A module adapted to process a wafer, comprising a processing portion having:
 a load port through which a wafer may be lowered into the processing portion;
 an unload port, horizontally displaced from the load port, such that the wafer may be raised out of the processing portion at the unload port; and
 a rotatable wafer support for rotating an input wafer from a first orientation wherein the wafer is in line with the load port to a second orientation wherein the wafer is in line with the unload port and the second orientation is inclined from the first orientation.

2. The module of claim 1 wherein the rotatable wafer support is adapted such that the first orientation is substantially vertical and the second orientation is inclined from the first orientation.

3. The module of claim 1 wherein the rotatable wafer support is adapted such that the first orientation is inclined in a first direction, away from the unload port and such that the second orientation is inclined in a second direction, toward the unload port.

4. The module of claim 2 wherein the processing portion further comprises a slanted back wall adjacent the unload port.

5. The module of claim 3 wherein the processing portion further comprises a slanted front wall adjacent the load port, and a slanted back wall adjacent the unload port.

6. A module adapted to process a wafer, comprising a processing portion having:
 a load port through which a wafer may be lowered into the processing portions an unload port, horizontally displaced from the load port, such that a wafer may be raised out of the processing portion at the unload port;

an external overflow weir positioned along the exterior of the processing portion; and a separation wall positioned between the load port and the unload port so as to divide an upper region of the processing portion into a first section and a second section, and so as to deter surface fluid from traveling between the first section and the second section.

7. The module of claim 6 wherein the separation wall comprises an internal overflow weir adapted to receive fluid overflowed from at least one of the first section and the second section.

8. The module of claim 6 wherein the separation wall comprises an internal overflow weir adapted to receive fluid overflowed from the first section and the second section.

9. A module comprising:

a processing portion having:
  a load port through which a wafer may be lowered into the processing portion; and
  an unload port, horizontally displaced from the load port, such that the wafer may be raised out of the processing portion at the unload port; and
an output portion having:
  a first wafer receiver adapted to receive a wafer raised through the unload port; and a catcher coupled to the wafer receiver and adapted to contact a wafer being elevated from the unload port and to elevate passively therewith.

10. The module of claim 9, wherein the catcher is adapted to secure an upper region of the wafer.

11. The module of claim 10 further comprising a finger coupled to the wafer receiver and adapted to selectively move between a wafer passage position, and a wafer securing position wherein the wafer securing position is adapted to contact and secure a lower region of a wafer such that the wafer is secured between the catcher and the finger when the finger is in the wafer securing position.

12. The module of claim 9 wherein the processing portion further comprises a slanted back wall adjacent the unload port.

13. The module of claim 12 wherein the processing portion further comprises slanted guide rails for guiding a wafer that is output through the output port in an inclined orientation.

14. The module of claim 12 further comprising:

a rotatable wafer support for rotating an input wafer from a first orientation wherein the wafer is in line with the load port to a second orientation wherein the wafer is in line with the unload port.

15. The module of claim 14 wherein the rotatable wafer support is adapted such that the first orientation is substantially vertical and the second orientation is inclined from the first orientation.

16. The module of claim 14 wherein the rotatable wafer support is adapted such that the first orientation is inclined in a first direction, away from the unload port and such that the second orientation is inclined in a second direction, toward the unload port.

17. The module of claim 14 wherein the processing portion further comprises a slanted front wall adjacent the load port, and a slanted back wall adjacent the unload port.

18. The module of claim 9 further comprising:

separation wall positioned between the load port and the unload port so as to divide an upper region of the processing portion into a first section and a second section, and so as to deter surface fluid from traveling between the first section and the second section.

19. The module of claim 18 wherein the separation wall comprises an internal overflow weir adapted to receive fluid overflowed from at least one of the first section and the second section.

20. The module of claim 18 wherein the separation wall comprises an internal overflow weir adapted to receive fluid overflowed from the first section and the second section.

* * * * *